(12) United States Patent
Nielsen et al.

(10) Patent No.: US 7,936,176 B2
(45) Date of Patent: May 3, 2011

(54) METHOD FOR PROVIDING ALIGNMENT OF A PROBE

(75) Inventors: Peter Folmer Nielsen, Farum (DK); Peter R. E. Petersen, Hillerod (DK); Jesper Erdman Hansen, Bagsvaerd (DK)

(73) Assignee: Capres A/S, Lyngby (DK)

( * ) Notice: Subject to any disclaimer, the term of this patent is extended or adjusted under 35 U.S.C. 154(b) by 498 days.

(21) Appl. No.: 11/570,965

(22) PCT Filed: Jun. 21, 2005

(86) PCT No.: PCT/DK2005/000417
§ 371 (c)(1),
(2), (4) Date: Aug. 28, 2008

(87) PCT Pub. No.: WO2005/124371
PCT Pub. Date: Dec. 29, 2005

(65) Prior Publication Data
US 2009/0009200 A1    Jan. 8, 2009

(30) Foreign Application Priority Data

Jun. 21, 2004 (EP) ................................. 04388039
Sep. 28, 2004 (EP) ................................. 04388065
Jan. 27, 2005 (EP) ................................. 05388003

(51) Int. Cl.
*G01R 31/00*    (2006.01)
*G01R 31/20*    (2006.01)

(52) U.S. Cl. ......... 324/750.16; 324/754.03; 324/755.01; 29/874; 29/884; 438/18; 257/48

(58) Field of Classification Search .................. 324/758, 324/750.16–750.29; 257/48; 438/14–18; 29/874–884
See application file for complete search history.

(56) References Cited

U.S. PATENT DOCUMENTS

| | | |
|---|---|---|
| 5,347,226 A | 9/1994 | Bachmann et al. |
| 5,475,318 A | 12/1995 | Marcus et al. |
| 5,545,291 A | 8/1996 | Smith et al. |
| 5,811,017 A | 9/1998 | Matsuyama |
| 5,929,438 A | 7/1999 | Suzuki et al. |
| 6,232,143 B1 | 5/2001 | Maddix et al. |
| 6,343,369 B1 | 1/2002 | Saunders et al. |
| 6,358,762 B1 | 3/2002 | Kohno et al. |

(Continued)

FOREIGN PATENT DOCUMENTS

EP   0974845   1/2000

(Continued)

*Primary Examiner* — Ha Tran T Nguyen
*Assistant Examiner* — Emily Y Chan
(74) *Attorney, Agent, or Firm* — Klein, O'Neill & Singh, LLP

(57) ABSTRACT

A method for aligning a probe relative to a supporting substrate defining a first planar surface, an edge, and a first crystal plane includes the steps of masking the surface of the substrate to define an exposed area on the first surface at the edge; and etching, using an etch reagent, a recess in the exposed area, the recess defining first and second opposed sidewalls, an end wall remote from the edge, and a bottom wall. The method further includes the step of providing a probe substrate defining a second planar surface and a second crystal plane identical to the first crystal plane, and positioning the probe substrate so that the first and the second crystal planes are positioned identically when forming a probe from the probe substrate using the etch reagent, wherein the probe defines congruent surfaces to the first and second sidewalls.

14 Claims, 11 Drawing Sheets

U.S. PATENT DOCUMENTS

| | | | |
|---|---|---|---|
| 6,479,395 B1 | 11/2002 | Smith et al. | |
| 6,507,204 B1 | 1/2003 | Kanamaru et al. | |
| 6,566,149 B1 * | 5/2003 | Kanamaru et al. | 438/14 |
| 2002/0174715 A1 | 11/2002 | Kim et al. | |
| 2003/0013340 A1 * | 1/2003 | Martin et al. | 439/488 |
| 2003/0052703 A1 * | 3/2003 | Terada et al. | 324/754 |

FOREIGN PATENT DOCUMENTS

| | | |
|---|---|---|
| EP | 0886758 | 11/2001 |
| WO | WO00/03252 | 1/2000 |
| WO | WO03/046473 | 6/2003 |
| WO | WO03/096429 | 11/2003 |

\* cited by examiner

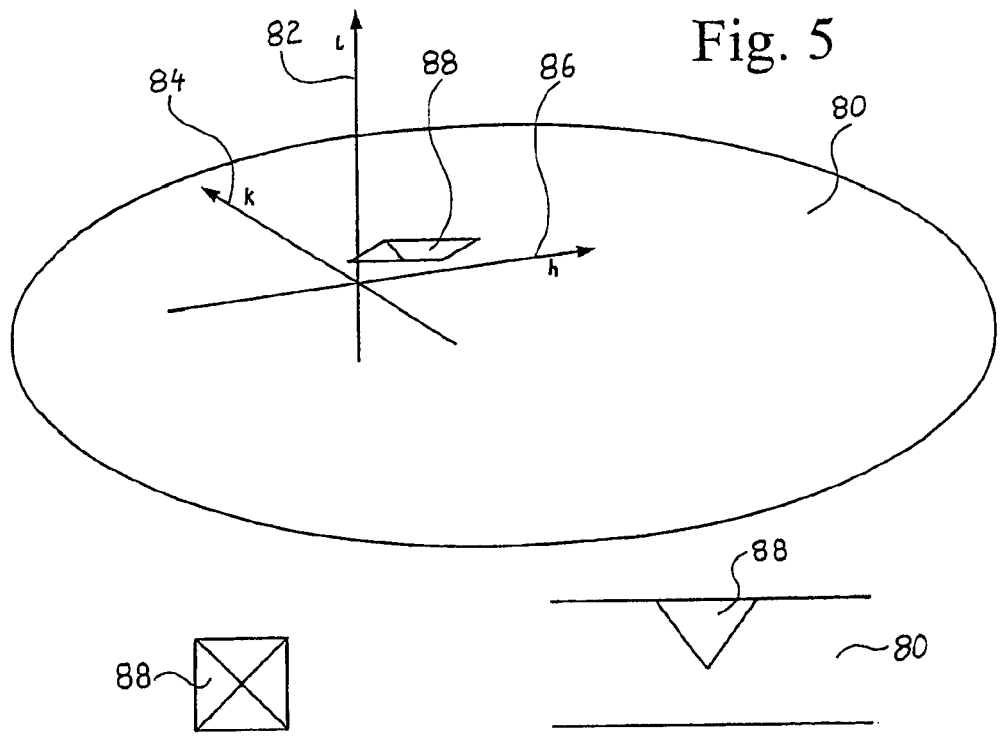
Fig. 5
Fig. 5a
Fig. 5b
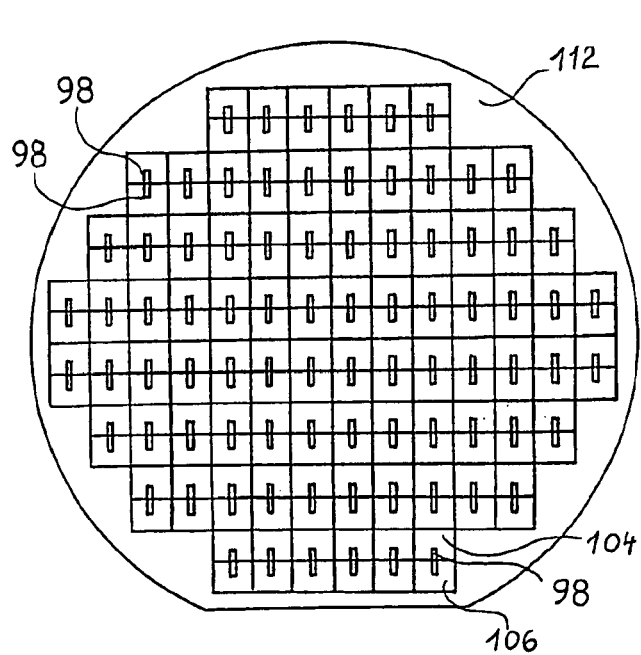
Fig. 7

METHOD FOR PROVIDING ALIGNMENT OF A PROBE

CROSS-REFERENCE TO RELATED APPLICATION

This application is a national phase filing, under 35 U.S.C. §371(c), of International Application No. PCT/DK2005/000417, the disclosure of which is incorporated herein by reference in its entirety.

FEDERALLY SPONSORED RESEARCH OR DEVELOPMENT

Not Applicable

BACKGROUND OF THE INVENTION

The present invention relates to a method for providing alignment of a probe relative to a supporting substrate.

The present invention further relates to a method for testing electrical properties of test samples. Still further, the present invention relates to probes for testing electrical properties on a specific location of a test sample. Specifically the present invention further relates to test probes including a cantilever part. Even further, the present invention relates to testing apparatuses for testing electrical properties of test samples.

Reference is made to the patent publications U.S. Pat. Nos. 6,358,762, 5,811,017, WO 03/096429, U.S. Pat. Nos. 6,232,143, 5,475,318, WO 03/046473, EP 0 886 758, EP 0 974 845, EP 1 095 282, U.S. Pat. Nos. 6,479,395, 5,545,291, 5,347,226, 6,507,204, 6,343,369, 5,929,438 and US 2002/174715, all of which are hereby incorporated in the present specification by reference in their entirety for all purposes.

SUMMARY OF THE INVENTION

According to a first aspect of the present invention a probe for testing electric properties on a specific location of a test sample is provided. The probe may comprise:

a supporting body defining opposite first and second parts constituting a flexible cantilever part being predominantly flexible in one direction and a base part respectively, the cantilever part defining an outer planar surface substantially perpendicular to the one direction, the base part being adapted for being fixated in a co-operating testing machine, at least one conductive probe arm in the cantilever part, each of the at least one conductive probe arm being positioned opposite the base part, the cantilever part defining opposite first and second regions, the second region being in contact with the base part, the first region defining first and second side surfaces, each of the first and second side surfaces defining a first angle with the outer planar surface, a first width defined between the first and the second side surfaces, the second region defining third and fourth side surfaces, each of the third and fourth side surfaces defining a second angle with the outer planar surface, a second width defined between the third and the fourth side surfaces, and the second width being equal to or smaller than the first width.

The supporting body constitutes the entire probe, and may be formed as a single unitary piece or by assembling two or more pieces. The probe may further comprise a first transitional area between the areas defining the first and second widths.

The conductive probe arms may be freely extending from the cantilever part opposite the base part thereby giving each of the conductive probe arms flexible motion. However, the conductive probe arms may alternatively be formed not extending from the cantilever part, but possibly near or at an edge of the cantilever part. The conductive probe arms may be positioned at any of the surfaces of the cantilever part.

The term "predominantly flexible in one direction" is to be understood as the distal part of the probe flexible in one direction, but also flexible in other directions, so that if the probe is brought in contact with a test sample, whilst being tilted, the flexibility in multiple directions enables a perfect or near perfect alignment of the probe with the test sample.

The probe may include a third area defining a third width on or in the supporting body. The third width may be equal to the first or second width. Alternatively, the third width may be different from both the first and second widths.

The cantilever part may include a part where the thickness of the distal end is thicker than other parts of the cantilever part. The probe head may include a protruding or ridge part.

According to the teachings of the present invention the first and second side surfaces may be substantially parallel the third and fourth side surfaces may be substantially parallel. The first and second sides, and correspondingly third and fourth sides, may also define an angle between them, thereby possibly giving the cantilever part a wedge form or a V-form. The first, second, third and fourth sides need not be defined in the entire area constituting the sides of the cantilever part. When producing probes of this sort, the production method includes etching which in real world applications does not product perfect planar surfaces.

According to the teachings of the present invention the first angle may be 60 to 90 degrees the second angle may be approximately 60 to 90 degrees, preferably below 90 degrees. The first angle may be 0 to 90 degrees, such as 5 to 89 degrees, such as 10 to 80 degrees, such as 15 to 75 degrees, such as 20 to 70 degrees, such as 25 to 60 degrees, such as 30 to 56 degrees, such as 44 to 55 degrees, such as 0 to 5 degrees, such as 5 to 15 degrees, such as 15 to 25 degrees, such as 25 to 35 degrees, such as 35 to 45 degrees, such as 45 to 50 degrees, such as 50 to 55 degrees, such as 55 to 65 degrees, such as 65 to 75 degrees, such as 75 to 85 degrees, such as 85 to 90 degrees, preferably 54.7 degrees or 45 degrees or 46.5 degrees, or 35.3 degrees or 33.5 degrees.

The first angle may be identical to or different from the second angle. The angle or angles may be defined between any of the surfaces in any direction possible. The angled sides is contemplated to decrease the overall weight of the probe head and also to give the probe an advantageous shape for easing or improving the way the probe head is brought into contact with the test sample.

An object of the present invention is to provide a probe where the first region further defines a first top surface and an opposite, parallel first bottom surface, and the second region further defines a second top surface and an opposite, parallel second bottom surface, the base part defining a third top surface, the first, the second and the third top surface being substantially parallel, the outer planar surface being constituted by the first top surface and/or the second top surface, a first thickness defined between the first top surface and the first bottom surface, a second thickness defined between the second top surface and the second bottom surface, the second thickness being smaller than or equal to the first thickness.

The first and the second thickness are preferably not equal, thereby defining a probe having a part where the probe is attenuated, possibly being an area between a base part and the distal end of the cantilever part. Surprisingly, the thinned or attenuated area gives the probe an advantageous flexibility compared to probes known in the art.

The probe according to the teachings of the present invention may include an attenuated or thinned area in the cantilever arm. The cantilever arm may be attenuated in one, two or three dimensions, alternatively in any combinations thereof.

The ratio between the first and the second thickness may be 1:1,05 to 1:50, such as 1:1,5 to 1:40, such as 1:2 to 1:30, such as 1:2,5 to 1:20, such as 1:3 to 1:10, such as 1:4 to 1:5, such as 1:1,05 to 1:2, such as 1:2 to 1:3, such as 1:3 to 1:5, such as 1:5 to 1:10, such as 1:10 to 1:20, such as 1:20 to 1:50. The smaller or thinner area is contemplated to increase or give an advantageous flexibility to the probe.

As previously mentioned, the physical embodiment of the present invention will not, in the mathematical sense, be precisely or perfectly planar; however in the present context the substantially planar surfaces are to be construed as perfectly planar.

According to a specific feature of the present invention the second thickness may be defined across the entire second region a specific part of the second region. Meaning that the area where the second region has a different thickness that the first region may be restricted to a specific area rather than the entire area. Thereby an embodiment having a specific area in the second region with either a smaller or larger thickness than the first region may be produced. The area having a different thickness is contemplated to provide flexibility to the probe.

According to a first feature of the present invention the first top surface and the second top surface may be substantially coplanar.

According to a second feature of the present invention the first top surface and the third top surface may be substantially coplanar.

According to a third feature of the present invention the second top surface and the third top surface being substantially coplanar.

According to a fourth feature of the present invention none of the first, second or third top surfaces may be substantially coplanar.

According to a fifth feature of the present invention the first and the second bottom surfaces may be substantially coplanar.

The above-mentioned first, second, third, fourth and fifth features may be utilized individually or in any combinations.

It is an advantage of the present invention that the second region may include at least one aperture extending from the second top surface to the second bottom surface. Probes having one aperture may be desirable when placing conductive probe arms in the cantilever part, since there is a need for placing electrical conductive paths from each of the conductive probe arms to a co-operating testing machine. Also a probe having one large aperture or opening may enable the sides of the connecting area to function as a hinge or the like, providing a high degree of flexibility. The use of an aperture or apertures is contemplated to provide more flexibility to the cantilever probe. The hinge mechanism described above is also contemplated to be present in embodiments including more than one aperture and/or thinned area or areas.

The probe may include a transitional area between the parts having different thicknesses. The transitional area may define angled surfaces.

Surprisingly, forming an L-shaped structure in one or more sides of an aperture in the second region moves or changes the point where the probe will flex when brought into contact with the test area of the test sample. The L-shaped structure may be formed in two sides with one or more apertures defined in between them.

In alternative embodiments, the second region may include recesses instead of apertures whereby one or more basins or recesses are formed in the second region. The basins are contemplated to improve the flexibility of the cantilever part of the test probes compared to the test probes known in the art.

It is a further advantage of the present invention that the second region may include at least one indentation, notch, depression, dent, recess, dimple or any combinations thereof, extending less than the second thickness. The indentation, cut, incision, notch, nick, dimple or serration constitutes an area or volume of the probe where material has been removed, has never been present. The reduced amount of material is contemplated to provide more flexibility to the cantilever probe.

It is a particular advantage of the present invention that at least one of the apertures or the indentations may define an opening having a substantially circular geometry, a substantially oval geometry, a substantially square geometry, a substantially oblong geometry, a substantially triangular geometry, a truncated triangular geometry, any polygonal geometry or any combinations thereof.

According to a first object of the present invention the second region may include at least one groove in the second top surface in the second bottom surface.

According to a second object of the present invention at least one groove may extend from the third side to the fourth side. Also the at least one groove may extend less that the second width, either from the third or fourth sides. Further alternatively the groove may extend from either the third or fourth sides in an angle in relation with the side from which the groove extends.

The groove or grooves are contemplated to provide more flexibility to the cantilever probe.

Furthermore at least one of the grooves may define a rounded cross-section, a square cross-section, a rectangular cross-section, a triangular cross-section, a truncated triangular cross-section, any polygonal cross-section or any combination thereof.

It is a specific advantage of the present invention that the third the fourth side may include a trench extending at least partly from the second top surface to the second bottom surface or from the second bottom surface to the second top surface. Also the trench may define a rounded cross-section, a square cross-section, a rectangular cross-section, a triangular cross-section, a truncated triangular cross-section or any combination thereof. The trench or trenches are contemplated to provide more flexibility to the cantilever probe.

The trench or the groove, alternatively both the trench and the groove, may have varying depths along the path of which the groove extends. Preferably the groove or trench has substantially the same depth along the path of which it extends.

According to a specific feature of the present invention the cantilever may made from a metallic material, an alloying, a semiconductor material, a crystalline or amorphous material, or any combination thereof. Preferably, the device may be made from $SiO_2$, $Si_3N_4$, or $Si$, and may be a SOI device or alternatively a layered structure comprising any of the mentioned materials.

It is an object of the present invention to include conductive paths for establishing electrical connections to each of the plurality of conductive probe arms on or in the probe. Further, the conductive paths may extend from the base part to the cantilever part of the probe. Still further, the plurality of conductive probe arms may be positioned at the outer planar surface. The outer planar surface may be any of the surfaces, e.g. the one or more of the side surfaces of the cantilever part, the bottom surface of the cantilever part or alternatively the top surface of the cantilever part. Further alternatively the plurality of conductive probe arms may be positioned/distributed at or on two or more sides, edges or surfaces at once.

The number of conductive probe arms may range from one to any number of probes possible to place on the cantilever part. The number of conductive probe arms may be limited by the space occupied by the individual conductive probe arm and the space available at the surface or edge of the cantilever part. As mentioned above, the conductive probe arms may be positioned all at one side or in any distribution among the sides. Embodiments having 2 or more probe arms are contemplated to be advantageous.

In an embodiment including more than 4 probe arms, any combination of 4 probe arms may be used to perform 4-point measurements. There is not given any preference to embodiments having even or odd number of probe arms. Generally, the co-operating testing machine may be able to address one, more or all of the conductive probe arms simultaneously. Preferably the testing machine may address any number of the conductive probe arms.

According to a sixth feature of the present invention, the first width may be 50 to 800 micron, such as 75 to 750 micron, such as 75 to 500 micron, such as 80 to 350 micron, such as 85 to 250 micron, such as 90 to 150 micron, such as 60 to 90 micron, such as 90 to 110 micron, such as 110 to 190 micron, such as 190 to 240 micron, such as 240 to 290 micron, such as 290 to 340 micron, such as 340 to 440 micron, such as 440 to 550 micron, such as 550 to 650 micron, such as 650 to 800 micron, preferably 100 micron.

According to a seventh feature of the present invention, the second width may be 40 to 300 micron, such as 50 to 250, such as 75 to 200 micron, such as 100 to 175 micron, such as 120 to 150, such as 40 to 80 micron, such as 80 to 120 micron, such as 120 to 160 micron, such as 160 to 200 micron, such as 200 to 230 micron, such as 230 to 280 micron, such as 280 to 300 micron.

According to an eighth feature of the present invention, the first width may be 0.1 cm to 6 cm, such as 1 cm to 5.5 cm, such as 1.5 cm to 5 cm, such as 2 cm to 4.5 cm, such as 2.5 cm to 4 cm, such as 3 cm to 3.5 cm, such as 0.1 cm to 0.5 cm, such as 0.5 cm to 1 cm, such as 1 cm to 1.5 cm, such as 1.5 to 2 cm, such as 2 cm to 2.5 cm, such as 2.5 cm to 3 cm, such as 3 cm to 3.5 cm, such as 3.5 cm to 4 cm, such as 4 cm to 4.5 cm, such as 4.5 to 5 cm, such as 5 cm to 5.5 cm, such 5.5 cm to 6 cm. Also, the first width may be greater that 6 cm or smaller than 0.1 cm.

According to an ninth feature of the present invention, the second width may be 0.1 cm to 6 cm, such as 1 cm to 5.5 cm, such as 1.5 cm to 5 cm, such as 2 cm to 4.5 cm, such as 2.5 cm to 4 cm, such as 3 cm to 3.5 cm, such as 0.1 cm to 0.5 cm, such as 0.5 cm to 1 cm, such as 1 cm to 1.5 cm, such as 1.5 to 2 cm, such as 2 cm to 2.5 cm, such as 2.5 cm to 3 cm, such as 3 cm to 3.5 cm, such as 3.5 cm to 4 cm, such as 4 cm to 4.5 cm, such as 4.5 to 5 cm, such as 5 cm to 5.5 cm, such 5.5 cm to 6 cm. Also, the second width may be greater that 6 cm or smaller than 0.1 cm.

A probe implemented according to the eight and ninth features of the present invention may be useful when testing electrical properties of wafers comprising a number of electrical components such as transistors.

A tenth feature of the present invention relates to the cantilever part having rounded edges or corners at the distal end. This is contemplated to enable the cantilever to achieve a better alignment with the substrate on which electrical properties are to be measured.

According to a second aspect of the present invention a testing apparatus for testing electric properties on a specific location of a test sample is provided. The testing apparatus may comprise:
  (a) means for receiving and supporting the test sample;
  (b) electric properties testing means including electric generator means for generating test signal and electric measuring means for detecting a measuring signal;
  (c) a probe for testing electric properties on a specific location of a test sample, comprising:
    1. a supporting body defining opposite first and second parts constituting a flexible cantilever part predominantly being flexible in one direction and a base part respectively, the cantilever part defining an outer planar surface substantially perpendicular to the one direction, the base part being adapted for being fixated in a co-operating testing machine,
    2. at least one conductive probe arm in the cantilever part, each of the at least one conductive probe arm being positioned opposite the base part,
    3. the cantilever part defining opposite first and second regions, the second region being in contact with the base part, the first region defining first and second side surfaces, each of the first and second side surfaces defining a first angle with the outer planar surface, a first width defined between the first and the second side surfaces, the second region defining third and fourth side surfaces, each of the third and fourth side surfaces defining a second angle with the outer planar surface, a second width defined between the third and the fourth side surfaces,
    4. the second width being equal to or smaller that the first width
  (d) reciprocating means for moving the probe relative the test sample so as to cause the conductive probe arms to be contacted with the specific location of the test sample for performing the testing of electric properties thereof.

The testing apparatus according to the second aspect of the present invention basically includes a point probe according to the first aspect of the present invention, which probe, constituting a component of the point testing apparatus according to second aspect of the present invention, may be implemented in accordance with any of the above features of the probe according to the first aspect of the present invention. Furthermore, in the testing apparatus according to the second aspect of the present invention the electric properties testing means may further comprise means for electric properties probing of the test sample.

According to the teachings of the present invention the reciprocating means may further comprise holding means adapted for co-operatively receiving the base part of the probe. Also the testing apparatus may further comprise means for positioning the holding means across the test sample and recording of a location of the holding means relative to the test sample.

The means for positioning may advantageously be maneuverable in all spatial directions, being directions coplanar to the test sample and directions perpendicular to the test sample.

Further advantageously the means for positioning may further comprise means for angular movement of the holding means, so as to provide angular positions for the means for the probe. Even further, the means for positioning may further comprise means for angular movement of the holding means along an axis parallel to surface of the test sample, such as to provide angular positions for the means for the probe. Still further the means for positioning may even further comprise means for angular movement of the holding means along an axis perpendicular to surface of the test sample, such as to provide angular positions for the means for the probe.

According to a eleventh feature of the present invention the means for positioning further comprising means for sensing contact between the test sample and the means for the probe.

Most advantageously the probe according to the second aspect of the present invention may further include any of the features mentioned in relation to the first aspect of the present invention.

Traditionally, probes are glued onto an aluminum, or aluminum oxide, substrate, a process that contains a certain amount of alignment error by means of tilt and rotation of the probe before and during the curing of the glue. An angular uncertainty of 1~2° is sufficient to compromise the measuring quality. However, a substrate is necessary to support the probe in the measuring head. Here, a self-aligning substrate that is integrated in the measuring head as a semi-permanent part is to be described.

In a crystalline structure, a co-ordinate system may be defined for describing the crystalline orientation of the molecules. Commonly, the axis of a co-ordinate system of this sort is denoted l, h and K.

The crystallographic directions are also used to specify physical directions in the material. A direction parallel with a I-axis is denoted by means of square brackets: [001]. All the directions that are parallel with one and only one crystallographic axis are then denoted <100>, i.e. using regular brackets denotes the family of symmetrically equivalent directions, which have the same relationship towards a set of crystallographic axes but where the actual direction does not need to be specified.

Semiconductors are a group of materials having conductivities between those of metals and insulators. The atoms of the semiconductor materials when in solid state are arranged in crystal structures. The crystal structures may be characterised by a unit cell. The crystal structure is characterized by a 3-dimensional periodicity which can be realized by several different geometries illustrated by a unit cell. The unit cell is a small volume which is repeated throughout the material at specific intervals. The unit cell may have any of a number of geometries such as cubic or non-cubic, such as tetragonal, orthorhombic, monoclinic, triclinic, hexagonal, rhombohedral or any other geometry. The geometry of the unit cells is described in the literature.

Silicon is arranged in a diamond crystal structure with 8 atoms per unit cell. Other physical properties include a melting point of 1415° C. and a density of 2.3 g per cm$^3$.

Silicon may be readily oxidized at high temperature forming very stable, robust oxides that are highly resistant to almost all anisotropic etchings. Silicon dioxide may therefore be easily used as an almost perfect and inexpensive masking material. A vast variety of different micromechanical structures may be obtained using combinations of different parameters such as mask design, orientation of the mask with respect to different crystallographic directions, the orientation of the crystal of the starting silicon wafer, the level of doping using boron impurities, and composition of concentration of etching solution and the time used for the etching.

The diamond cubic structure of the silicon may be described as two interpenetrating face-centered cubes displaced from each other along the X, Y and Z axes for ¼ of the latter spacing, i.e. the length of the unit cell.

The atoms in solid Ge is arranged in a crystal structure almost identical to Si. Also ⅗ semiconductors, such as GaAs or Zinc blende has the same crystal structure as Si.

When etching the silicon material, several different types of solutions exist, such as etching using EDP, KOH, NaOH and LiOH etching solutions where KOH is the most popular and commonly used etchant. A typical etching rate for KOH with the silicon crystal planes far away from {111} plane are about 1 μm per minute. To the KOH solution, isopropyl alcohol may be added as an addition of isopropyl alcohol is meant to decrease the edge rate.

For masking purposes, generally any slow etching material in a specified etching solution may be applied as a mask. Both dielectrics and metals may serve as masking materials for anisotropic silicon etching such as silicon oxide, silicon nitride, gold, chromium, silver or the like.

The idea behind the self-alignment is to exploit the nature of the {111}-planes of silicon. Since the sidewalls of the probe are 100% well defined with respect to each other, these sidewalls will fit perfectly into a grave that has the same angling of its sidewall. By means of KOH-etching in a silicon {100}-wafer, a grave with an outline that fits exactly to the imprint of the bottom of a probe may be produced. This grave will be referred to as a probe receptacle or recess.

According to a third aspect of the present invention, a method for providing alignment of a probe relative to a supporting substrate is provided. The method may comprise the steps of:

providing the supporting substrate defining a planar surface and an edge, the substrate defining a first crystal plane, providing a first mask at the surface of the supporting substrate, the first mask defining a first exposed area on the surface at the edge, providing a specific etch reagent, the recess formed by the etch reagent etching the first exposed area, the recess defining a first sidewall an opposing second sidewall, an end wall remote from the edge, and a bottom wall, providing a probe substrate defining a planar surface and a second crystal plane identical to the first crystal plane, using the specific etch reagent so that the probe defines congruent surfaces to the first sidewall and the second sidewall, positioning the probe substrate so that the first and the second crystal planes are positioned identically.

The supporting substrate and the probe substrate are in the presently preferred embodiment of the present invention made from identical materials. However, different materials having identical crystal structure may be used. The orientation of the crystal planes during etching has an impact on the resulting structure. E.g. the speed of the etching will be different when etching in different angles or direction to the crystal structure. It is preferable to use a specific etch reagent in a specific direction to given material having a specific crystal structure.

Provided the etching have been performed in identical direction in relation to the crystal structure, the recess and the probe will have side walls that will enable the probe to be positioned within the recess in an appropriate manner. The side walls of the recess will define a first specific angle with the top surface of the supporting substrate. The side walls of the probe will define a second specific angle with the top surface of the probe. Provided the supporting substrate and the probe substrate both define substantially planar surfaces, the first and the second specific angle will be supplementary angles. The sidewalls of the recess and the sidewalls of the probe will be parallel two and two, i.e. the sidewalls that are to be in facial contact, when the probe is received in the recess, will be parallel. A special combination of material having a specific crystal structure and using a specific etch reagent gives the desired structure of the recess in the support substrate and the probe, thereby ensuring that the surfaces of the recess and the probe substrate are congruent or matching, so that the probe will fit perfectly in the recess.

The probe used in relation to the third aspect of the present invention may include any of the features of the probe according to the first aspect of the present invention. Also, the testing apparatus according to the second aspect of the present invention may include any of the features of the probe supporting substrate of the third aspect of the present invention.

According to a twelfth feature of the present invention, the specific etch reagent may be provided at a specific concentration. The concentration of the etch-reagent may have an influence on the formation of the recess the probe.

According to a thirteenth feature of the present invention, a specific temperature at which the etching is performed may be provided. The temperature at which the etch-reagent is exposed to the substrates may have an influence on the formation of the recess the probe. Also, a specific pressure at which the etching is performed may have an influence on the formation of the recess the probe. Further, the specific etch reagent the temperature the specific pressure may be applied for a specific period of time. The period of time, for which the probe and supporting substrates are exposed to the reagent, the temperature the pressure, respectively, may have an influence on the formation of the recess and/or the probe.

According to the teachings of the present invention, the material used to form the probe the supporting substrate may be Si, GaAs, any other semiconductor material, combinations thereof, or any other single crystalline material with anisotropic etching properties similar to those of semiconductor materials.

According to a fourteenth feature of the present invention, a second mask may be provided at the bottom wall. The second mask may define a second exposed area, a protruding area formed in the bottom surface by etching the second exposed area using the specific etch reagent. Also, a second specific etching reagent may be employed.

A fifteenth feature of the present invention relates to the protruding area that may define a cross-section having a substantially square, rectangular, triangular, truncated pyramid, polygonal, semi-circular, partly circular, semi-elliptical, partly elliptical geometry or any combinations thereof.

According to the teachings of the present invention, the method of the third aspect may further comprise providing at least one conducting area in the first sidewall said second sidewall said end wall or any combinations thereof.

The conducting area, pad or electrode is contemplated to establish electrical contact to/from the probes to a measuring machine or apparatus by establishing electrical contact between conductive paths on the probe and conductive paths on the supporting substrate or holder of the probe. This may be improved by further providing extensions of the at least one conducting area onto the planar surface.

A sixteenth feature relates to positioning the probe in alignment with the recess in accordance with the third aspect of the present invention.

The supporting substrate may have one or more electrically conductive paths formed in or on the surface of the substrate any or all of the sidewalls and/or the end wall, for establishing electrical connection to the probe. Alternatively, the electrical connection may be established by bonding wires directly to pads on the surface of the probe it self.

According to a fourth aspect of the present invention, an apparatus for providing alignment of a probe relative to a supporting substrate is provided. The apparatus may comprise:
  the supporting substrate defining a surface and an edge, the supporting substrate defining a first crystal plane,
  a recess formed by a specific etch reagent in the surface at the edge of the supporting substrate, the recess defining a first sidewall an opposing second sidewall, an end wall remote from the edge, and a bottom wall,
  a probe formed from a probe substrate defining a surface and a second crystal plane identical to the first crystal plane using the specific etch reagent so that the probe defines congruent surfaces to the first sidewall and the second sidewall, the probe is positioned in the recess.

According to the teachings of the present invention, the probe used in the apparatus according to the fourth aspect, may include any of the features of the probe according to the first aspect of the present invention.

According to a seventeenth feature of the present invention, the bottom wall may include a protruding part and the probe may include a co-operating groove. Further, the protruding part may define a substantially square, rectangular, triangular, truncated pyramid, polygonal, semi-circular, partly circular, semi-elliptical, partly elliptical cross-section or any combinations thereof.

According to an eighteenth feature of the present invention, the protruding part may extend from the first side wall to the second side wall. Alternatively, the protruding part may extend from the first side wall to the end wall; further alternatively, the protruding part may extend from the second side wall to the end wall. Even further alternatively, two or more protruding parts may be included in the recess.

According to a nineteenth feature of the present invention, the supporting substrate may further include at least one substrate alignment mark and the probe includes at least one corresponding probe alignment mark. The alignment mark may be used for visually inspecting that the probe has been positioned correctly in the recess of the supporting substrate. Also, the alignment marks may be used by a machine while positioning the probe in the recess. Particularly, the substrate alignment mark the probe alignment mark may be constituted by an etched alignment recess alignment protruding part.

According to a fifth aspect of the present invention, a testing apparatus for testing electric properties on a specific location of a test sample is provided. The testing apparatus may comprise:
  means for receiving and supporting the test sample;
  electric properties testing means including electric generator means for generating a test signal and electric measuring means for detecting a measuring signal;
  a probe for testing electric properties on a specific location of a test sample, the probe received in an apparatus for providing alignment of the probe relative to a supporting substrate, the apparatus comprising:
  the supporting substrate defining a surface and an edge, the substrate defining a first crystal plane,
  a recess formed by a specific etch reagent in the surface at the edge of the supporting substrate, the recess defining a first sidewall an opposing second sidewall, an end wall remote from the edge, and a bottom wall defining a minimum height from the surface,
  the probe formed from a probe substrate defining a surface and a second crystal plane identical to the first crystal plane using the specific etch reagent so that the probe defines congruent surfaces to the first sidewall and the second sidewall, the probe received in the recess, reciprocating means for moving the probe relative the test sample so as to cause one or more conductive probe arms positioned on the probe to be contacted with the specific location of the test sample for performing the testing of electric properties thereof.

The apparatus according to the fifth aspect of the present invention may comprise any of the features produced by performing any of the steps according to the second, third or fourth aspect of the present invention. Also, the testing apparatus according to the second aspect of the present invention may include any of the features of the fourth and fifth aspect of the present invention.

A sixth aspect of the present invention relates to a method for testing electrical properties. The method comprises:
i) providing a test sample defining a first surface, an area defined on the first surface,
ii) providing a first test probe comprising:
    a first plurality of probe arms each including at least one electrode for contacting a respective location on the test sample,
iii) providing a second test probe comprising:
    at least one probe arm including at least one electrode for contacting a location on the test sample,
iv) providing a test apparatus including a first and a second holder for receiving the first and the second test probes respectively, each of the holders comprising positioning devices for positioning relocating each of the holders in three dimensions, the test apparatus being electrically connected to each of the electrodes of the first test probe and to the at least one electrode of the second test probe, the test apparatus further comprising a sample holder for receiving and holding the test sample in a specific orientation relative to the first and the second test probe,
v) positioning the electrodes of the probe arms of the first test probe in contact with the area,
vi) positioning the at least one electrode of the at least one probe arm of the second test probe in contact with the area at a location remote from the first test probe,
vii) transmitting a test signal from at least one of the electrodes of the first test probe, or, in the alternative from the at least one electrode of the second test probe, and detecting the test signal transmission between the first and the second test probe.

Additionally, the method according to the sixth aspect may further comprise intermediate steps after step vi):
a) providing a magnetic field generator for generating a magnetic field,
b) positioning the magnetic field generator so that the field lines of the magnetic field defines a specific orientation with the area of the test sample.

The method according to the sixth aspect of the present invention may further comprise the steps of:
c) relocating or moving the first test probe relative to the area and/or relocating or moving the second test probe relative to the area, and
d) repeating step vii) the intermediate steps a) b).

The movement of either one or both of the test probes is contemplated to allow for investigations of electrical properties of a greater area of the test sample, as there may be localized variations.

Moving both of the probes in the same direction and with the same speed, thereby maintaining a specific distance and orientation between the two, or more, test probes, is also possible.

The measurements may be performed while the test probes are moved; alternatively, the test probes are moved and then stopped before measurements are performed.

The present invention relates to a seventh aspect to a method for testing electrical properties, the method comprises:
i) providing a test sample defining a first surface, an area defined on the first surface,
ii) providing a first test probe comprising:
    a first plurality of probe arms each including at least one electrode for contacting a respective location on the test sample,
iii) providing a second test probe comprising:
    at least one probe arm including at least one electrode for contacting a location on the test sample,
iv) providing a test apparatus including a first and a second holder for receiving the first and the second test probes respectively, each of the holders comprising positioning devices for positioning and/or relocating each of the holders in three dimensions, the test apparatus being electrically connected to each of the electrodes of the first test probe and to the at least one electrode of the second test probe, the test apparatus further comprising a sample holder for receiving and holding the test sample in a specific orientation relative to the first and the second test probe,
v) positioning the electrodes of the probe arms of the first test probe in contact with the area,
vi) positioning the at least one electrode of the at least one probe arm of the second test probe in contact with the area at a location remote from the first test probe,
vii) providing a magnetic field generator for generating a magnetic field,
viii) positioning the magnetic field generator so that the field lines of the magnetic field defines a specific orientation with the area of the test sample, and
ix) detecting electrical signals at the first and/or the second test probes.

Additionally, the method according to the seventh aspect may further comprise the steps of:
a) transmitting a test signal from at least one of the electrodes of the first test probe, or, in the alternative from the at least one electrode of the second test probe, and
b) detecting the test signal transmission between the first and the second test probe.

Furthermore, the method according to the seventh aspect may event further comprise the steps of:
c) relocating or moving the first test probe relative to the area and/or relocating or moving the second test probe relative to the area, and
d) repeating step ix) the steps a) b).

The magnetic field may be generated by a permanent magnet, an electro-magnet, a coil or alternatively by any other device capable of generating a magnetic field. The magnetic field may be substantially constant, varying or a combination hereof.

The magnetic field source or generator preferably generates a magnetic field that defines a specific orientation with the area defined on the test sample. The orientation may be orthogonal, tilted or angled.

The magnetic field generator may be in a fixed location or be placed in a holder including positioning devices or means, such as actuators or the like.

The mentioned test sample is preferably a semiconductor device, such as an ASIC, a FPGA, a SOC or any other device of which the testing, diagnosing, detection or registration of electrical properties are to be performed.

The first test probe preferably has four probe arms each including at least one electrode; however, the test probe may have one, two, three, five, six, eight, twelve, fourteen or any other positive integer, number of probe arms. The probe arms are preferably The second test probe may include only one probe arm or more probe arms, such as four. The second test probe is preferably similar to the first test probe, i.e. in all of the physical dimensions, geometry etc. The second test probe may comprise a plurality of probe arms each comprising at least one electrode.

The test apparatus may include a housing in which the different components are placed or mounted. The housing may additionally provide a chamber in which the testing is performed. The chamber may provide the possibility of, or means for, controlling and monitoring the conditions under which the testing is performed, such as pressure, composition of air/atmosphere, temperature, vacuum or in vacuo conditions, moisture or any combinations thereof.

The holders in the test apparatus are moved by the positioning-devices, which preferably are constituted by piezo-electrical actuators, or any other actuators allowing control of the holders in sub-micron resolution.

The test probes are positioned so that at least one of the probe arms of each of the test probes are in contact with the test sample at at least two locations at some distance. The distance may be in the micron range or less; also, the distance may be greater.

A test signal may be applied to at least one of the electrodes from a signal generator via electrical connections on or in the test probe. Alternatively, the test signal is generated transmitted through or from the test-sample, e.g. via signal paths in or on the test-sample. This is contemplated to enable electrical-property tests, circuit tests and other tests.

The test signal may be constituted by an AC signal, a DC signal, a HF signal or any combination thereof. The test apparatus preferably includes detection devices for detecting the transmission of the test signal through the test sample. The detection may be recorded or detected and then sent to signal processors for obtaining more detailed information regarding the electrical properties of the test sample.

According to the teachings of the present invention, a multitude of electrode pads may be defined on the surface of the test sample and the method may further comprise bringing a first specific electrode in contact with a second specific electrode pad, bringing a third specific electrode in contact with a fourth specific electrode pad,
  transmitting a test signal from the first or the third specific electrode, and
  detecting the test signal transmission between the third or the first electrode, respectively.

The determination of the location of the electrode pads may be performed by visual inspection by moving a test probe until electrical tests show that contact with an electrode pad has been achieved.

The probe arms of the first test probe are, preferably, substantially parallel and the at least one probe arm of the second defines a longitudinal length. The probe arms preferably extend from a body forming a base part of the test probe, such as discussed in relation with the first to fifth aspect of the present invention. The test probes used in relation with the sixth aspect of the present invention, may incorporate any or all of the features of the probes and/or methods according to any of the first to fifth aspects of the present invention.

As the probe arms of each of the test probes may define a direction or length, arranging two or more of these test probes may result in several possible configurations.

Therefore, the method according to the sixth and/or seventh aspect of the present invention may further comprise:
  arranging the first and the second test probes so that the probe arms of the first test probe are substantially parallel with the at least one probe arm of the second test probe, or
  arranging the first and the second test probes so that the probe arms of the first test probe are in an orientation substantially orthogonal with the at least one probe arm of the second test probe.

Alternatively, any other angle between the probe arms of the test probes may be obtained, within the ranging from 0 to 360 degrees.

Specifically, at least one additional test probe comprising at least one probe arm including at least one electrode for contacting a location on the test sample, may be provied, and the method may the comprise:
  providing at least one additional holder in the test apparatus for receiving and holding the at least one additional test probe.

The at least one probe arm of the at least one additional test probe may define a longitudinal length. The method according to the sixth seventh aspect of the present invention may further comprise:
  arranging the first, the second and the at least one additional test probe in a arrangement where the probe arms of the first probe define a first angle with the at least one probe arm of the second test probe, and the probe arms of the first probe define a second angle with the one probe arm of the at least one additional test probe.

The first and second angles may be identical, i.e. the angles may be 120 degrees, or the first and second angle may be different.

The methods according to the sixth and seventh aspects of the present invention may incorporate any of the features of any of the aspects one to five or six of the present invention.

According to an eighth aspect of the present invention, an apparatus for testing electrical properties comprises:
  a housing,
  a first and a second holder for receiving a first and a second test probe, respectively, mounted in the housing, each of the holders comprising positioning devices for positioning relocating each of the holders in three dimensions,
  the first test probe comprising:
    a first plurality of probe arms each including at least one electrode for contacting a respective location on the test sample,
  the second test probe comprising:
    at least one probe arm including at least one electrode for contacting a location on the test sample,
  the test apparatus electrically connected to each of the electrodes of the first test probe and to the at least one electrode of the second test probe, the test apparatus further comprising a sample holder for receiving and holding a test sample in a specific orientation relative to the first and the second test probe, the test sample defining a first surface, an area defined on the first surface,
  a signal generator for generating a test signal electrically connected to a transmitter device for transmitting the test signal via at least one of the electrodes of the first test probe in contact with the area, or, in the alternative, via the at least one electrode of the second test probe in contact with the area, and
  a detection device for detecting the test signal transmission between the first and the second test probe.

Furthermore, the positioning-devices of the apparatus may be constituted by piezo-electrical actuators, alternatively by any other devices providing sufficient spatial movement resolution. Sufficient spatial movement resolution is preferably in the micron or sub-micron range, possibly even smaller ranges.

The probe arms of the first test probe may be substantially parallel and the at least one probe arm of the second may define a longitudinal length, the first and the second test probes may be arranged so that the probe arms of the first test probe are substantially parallel with the at least one probe arm of the second probe arm, or the first and the second test probes may be arranged so that the probe arms of the first test probe are in an orientation substantially orthogonal with the at least one probe arm of the second probe arm.

Advantageously, the apparatus may further comprise:

at least one additional test probe comprising:

at least one probe arm including at least one electrode for contacting a location on the test sample, and at least one additional holder in the housing of the test apparatus for receiving and holding the at least one additional test probe.

Also, the at least one probe arm of the at least one additional test probe may define a longitudinal length, the apparatus may further comprise:

the first, the second and the at least one additional test probe arranged in an arrangement where the probe arms of the first probe define a first angle with the at least one probe arm of the second test probe, and the probe arms of the first probe define a second angle with the one probe arm of the at least one additional test probe.

The apparatus according to the eighth aspect of the present invention may incorporate any of the features of any of the aspects one to seven of the present invention.

BRIEF DESCRIPTION OF THE DRAWINGS

The above mentioned objects, advantages and features, will be evident, along with numerous other objects, advantages and features, from the detailed description below, where FIG. 5 is a schematic illustration of a substrate, FIG. 5a is a schematic, zoomed view of a part of the substrate of FIG. 5, FIG. 5b is a schematic, zoomed, cross-sectional view of a part of the substrate illustrated in FIG. 5.

FIG. 7 is a schematic view of a wafer comprising a number of supporting substrates.

DETAILED DESCRIPTION OF THE INVENTION

Figure 1:
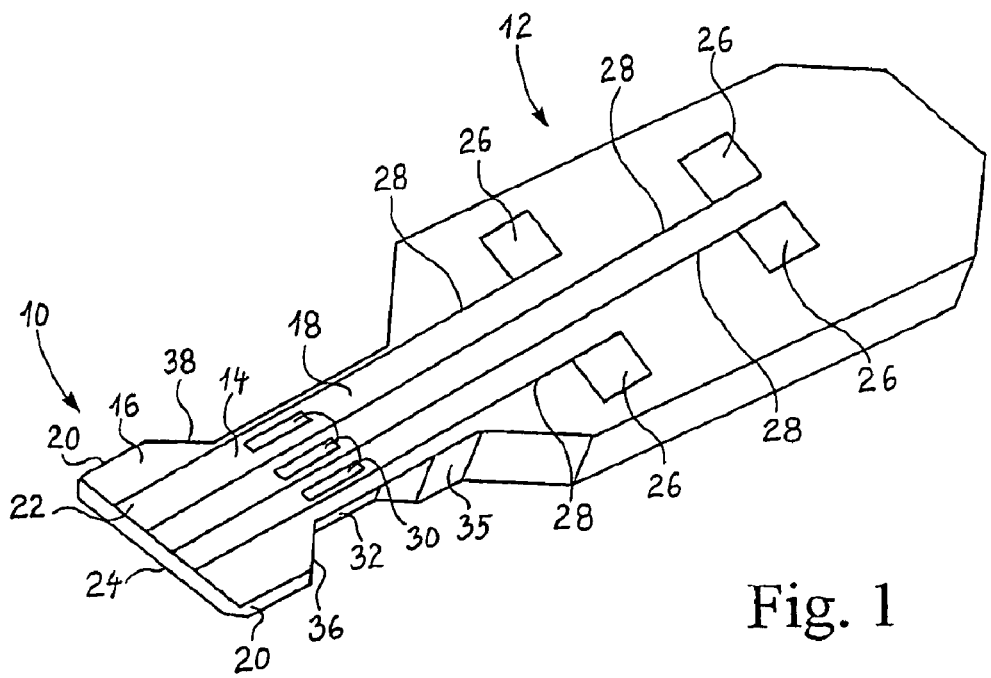
FIG. 1 is a schematic illustration of a probe according to the present invention.

FIG. 1 is a schematic illustration of a probe 10 for testing electric properties on a specific location of a test sample. The probe body comprises two parts, 12 and 14, constituting a base part and a flexible cantilever part respectively. The flexible cantilever part 14 comprises two regions, a distal region 16 and a connection region 18. The connection region 18 connects the cantilever part 14 with the base part 12.

In the presently preferred embodiment of the present invention the distal region 16 further comprises a plurality of conductive probe arms, not illustrated, for testing the electrical properties of a specific area on a test sample, also not illustrated. The conductive probe arms preferably extend from the top surface of the distal region 16. Alternatively, the conductive probe arms is positioned at one or more of the side surfaces 20 top 22 bottom 24 surfaces of the distal region 16.

For establishing electrical contact to a testing apparatus, the probe base 12 may include electrical connection pads 26, for establishing the electrical connections to the electrical conductive paths 28, that further establishes the electrical connections to the conductive probe arms.

The connection region 18 may comprise one or more areas where some of the material used to form the probe body have been removed. These areas may be constituted by one or more apertures, holes or indentations 30. The apertures 30 in FIG. 1 are illustrated as oblong apertures; however according to the teachings of the present invention, the apertures may have any geometrical configuration, such as round, square, oblong, elliptical, triangular or any polygonal geometry or combinations thereof.

The areas 30 need not be through going holes, but may be indentations, notches, depressions, dents, grooves, recesses, dimples or any combinations thereof.

Also, the connection region 18 may include areas where some of the material has been removed from the outside, such as the region designated 32 in FIG. 1. The connection region 18 may have a corresponding region on the side not illustrated in FIG. 1. The region 32 illustrated in FIG. 1 has a substantially flat surface that is perpendicular to the substantially flat surface of the connection region 18. However, the region 32 or a part hereof, may define an angle in relation to the surface of the connection region 18 different than 90 degrees, such as 45 degrees.

Part 35 of the side or bottom of the connection region 18 may define a different width than other parts of the connection region 18, such as the region 32. This thinner area enables the cantilever 14 to achieve a high degree of flexibility.

The connection region 18 and the distal part 16 may be interconnected by regions 36, 38. The regions 36, 38 may provide a better stability of the cantilever probe, but may also be omitted.

The base part 12 is preferably formed so as to fit into a co-operating receiving recess in a holder device, or the like, in a testing machine. When the probe 10 is positioned in a holder electrical connections may be established thereto via the pads 26.

Figure 2:
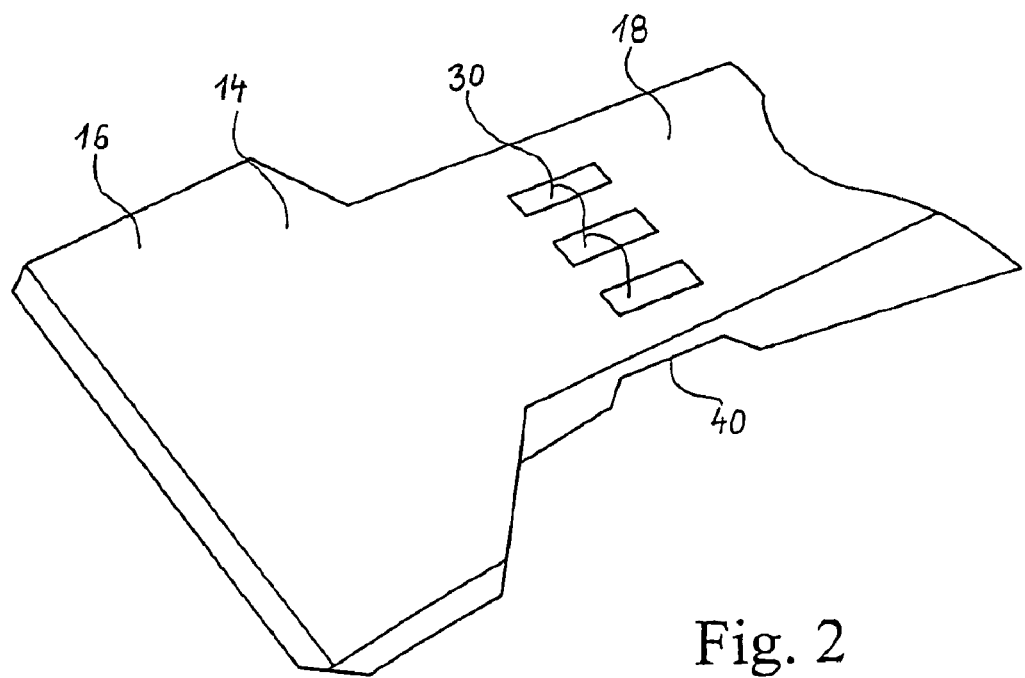
FIG. 2 is an enlarged view of a part of an alternative embodiment of a probe according to the present invention.
Figure 3A:
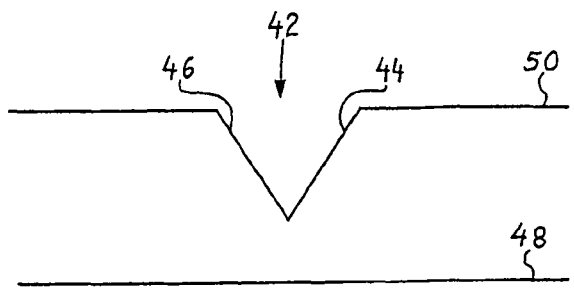
FIG. 3a-3c are schematic views of cross-sections of probes according to the present invention.
Figure 3B:
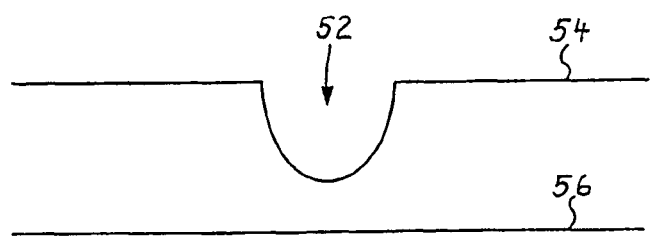
Figure 3C:
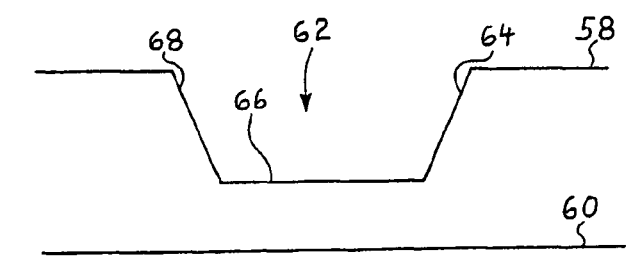

FIG. 2 is a zoomed view of the connection region 18 and the distal region 16 of an alternative embodiment the probe 10. Here an improved flexibility of the cantilever part 14 of the probe 10 is achieved by removing a part of the material across the connection region 18. In the embodiment illustrated in FIG. 2, the cut-out 40 has a truncated-triangular cross-section. Other possible cross-sections are illustrated in FIGS. 3a-3c. In FIG. 2 all of the electrical pathways are omitted from the illustration.

In both the embodiment illustrated in FIG. 1 and the embodiment illustrated FIG. 2 the number of apertures 30 is three; however, the number of apertures may be varied, from zero to as may as possible. The improved flexibility may be achieved by any of the means described above, i.e. one or more attenuated or thinned areas and/or one or more apertures.

The distal end of the cantilever part of the probe has in one corner been illustrated as having an angled surface and in the opposite corner a non-angled surface is illustrated. The presence or non-presence of an angled surface depends on the method used for producing probe, i.e. the etching and the etching solution.

In FIG. 3a a cross-section of a probe according to the present invention is illustrated. The probe 10 may at any surface include an indentation or cut-away area. The indentation or cut-away area may constitute the area 40 illustrated in FIG. 2, or be included in any of the surfaces of connection region 18, i.e. any of the side surfaces or top and/or bottom surfaces, also in any combinations thereof.

FIG. 3a specifically illustrates an area having a discontinuous indentation 42 in the surface 50, with a specific angle defined between the sidewalls 44, 46. The surface 48 opposite the surface 50 may also include an indentation.

FIG. 3b illustrates a surface 54 having a continuous indentation 52. The indentation 52 may have a hyperbolic or a semi-circular cross-section. The surface 56 opposite the surface 54 may also include an indentation.

FIG. 3c illustrates a surface 58 including an indentation or trench 62 defined by two sidewalls 64, 68 and a bottom wall 66. The two sidewalls 64, 68 define an angle between the two walls. The overall geometry of the trench may be substantially a truncated triangular. Provided the sidewalls 64, 68 are substantially parallel, the trench will define a substantially square or oblong cross-section.

Figure 4:
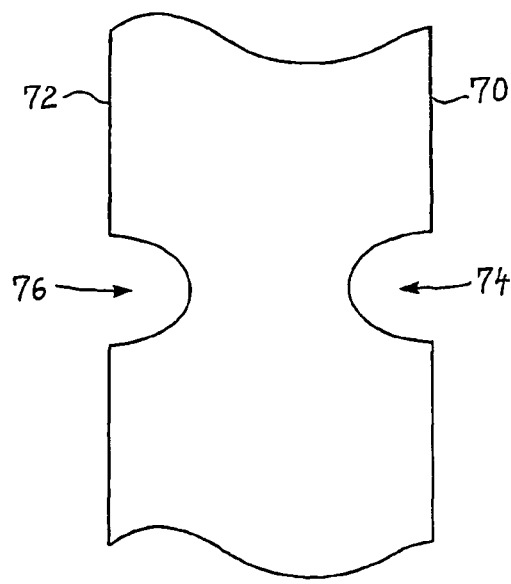
FIG. 4 is a schematic view of a part of a probe according to the present invention.

FIG. 4 illustrates a cross-section where two opposite surfaces 70, 72 both include indentations 74 and 76, here illustrated as having a substantially rounded bottom. Any surface may include one or more indentations, trenches or cut-away areas.

A method for producing probes in $SiO_2$ according to the present invention may comprise the following sequence of steps:
a) Validation and thickness adjustment of the wafer,
b) Wet thermal wafer oxidation at 900-950° C.
c) Front side lithography of silicon oxide pattern
d) Silicon oxide etch (anisotropic Reactive Ionbeam Etch (RIE))
e) Front side lithography of trench notch pattern
f) silicon trench etching (Deep RIE)
g) Low stress silicon nitride deposition (LPCVD)
h) Back side lithography (backside alignment)
i) Backside silicon nitride etch (anisotropic RIE)
j) HF etch through back side silicon oxide
k) Wet silicon etch (KOH)
l) Front side silicon nitride etch (anisopropic RIE)
m) Front side silicon etch (isotropic RIE)
n) Metal evaporation (e-beam; static mode)

An attenuation or thinning of the cantilever or connection area may be performed between step m and n in a deep reactive ionbeam etch, (DRIE) process.

A method for producing probes as SOI according to the present invention may comprise the following sequence of steps:
a) Low stress silicon nitride deposition (LPCVD)
b) Front side lithography
c) Front side silicon nitride etch (anisotropic etch)
d) Back side lithography (Back side alignment)
e) Back side silicon nitride etch (anisotropic RIE)
f) HF etch through front and back side silicon oxide
g) Wet silicon etch (KOH)
h) $SiO_2$ etch (bHF)
i) Front side silicon nitride etch (anisotropic RIE)
j) Monocantilever thinning (Deep RIE)
k) Electrode formation, e.g. metal evaporation and patterning.

The methods of producing the probes may be modified by persons skilled in the art.

In FIG. 5, orientation of a {100} surface 80 with respect to crystallographic axes 82, 84, 86 is illustrated. Etching through a mask hole results in pyramidal shaped grooves 88 defined by the {111}-planes illustrated in FIGS. 5a and 5b in detail. The base plane of the inverted pyramid is defined by 4 line elements being parallel with two <110>-directions.

The base material used for the manufacturing may be silicon {100} wafers. The digits in braces denote the orientation of the silicon surface with respect to crystallographic axes. With silicon {100} the wafer surface normally is parallel with one specific crystal axis. In FIG. 5, a wafer is shown together with the three axes h, k and I. In this example, the I-axis is normal to the wafer surface. The axes are drawn outside the wafer for convenience, but it is important to realize that this kind of co-ordinate system describes symmetry lines inside the material.

Surface planes defined by the crystallographic axes bound the material. Thus the front surface shown is the (001)-plane since it is normal to the third axis. Due to symmetry, the second axis or the first axis might be chosen to point upwards, the front surface would in those cases be denoted either a (010)-plane or a (100)-plane, respectively. The parentheses are used to denote specific orientations of planes. Since all these three planes have equivalent symmetry, they are commonly denoted {100}. The regular braces indicate a plane being a member of planes with the same crystal symmetry so that the {100}-planes are specifically normal to crystal axis but that the actual sequence of crystal axes is arbitrary.

Various gaseous and liquid compounds can etch silicon. One of these compounds is concentrated, aqueous KOH. However, KOH does not etch equally well in all directions of silicon. The <100>-directions are easy directions, whereas <111> are extremely slow directions. Now, since the {100}-planes and {111}-planes intercept along <110>-lines this has the following consequence, If a silicon {100} surface is covered with a chemically resistant mask layer with some holes in it, KOH will only be able to attack a rectangular area bounded by the <110>-lines that frame the hole in the mask. As the KOH etches downwards along the <100>-direction it will be confined by {111}-planes that emerge at the <110>-lines on the front surface. Such an etched hole 88 is shown in the wafer in FIGS. 5, 5a and 5b. If the front outline of the hole is quadratic, a pyramidal shaped hole will result, The two groove sketches shown in FIGS. 5a and 5b illustrate this. If the front outline is rather rectangular, the same four {111}- planes will bound the etched hole; however, one pair of oppositely oriented {111}-planes will become oblong resulting in a V-shaped oblong groove. If the mask hole is sufficiently small compared with the wafer thickness, the KOH-etch will simply stop once there are only {111}-planes left as shown in FIG. 5. If the front hole is sufficiently large, the KOH may etch all way through the wafer.

Since the {111}-planes are defined by crystallographic axes, their orientation with respect to the crystallographic axes are 100% well defined. A {111}-plane makes an angle of 350.2° with the [001]-direction and thus with the wafer normal. This angle is a geometric fact, given by the nature of the crystal symmetry.

An example of a multipoint probe has been described in details previously. A number of freely suspended probe pins may be etched into silicon dioxide on top of a silicon chip by means of traditional MEMS processes. The probe manufacturing process is summarized here because certain parts of it plays a decisive role in the subject of this description, namely the self-alignment of the probe upon mounting in a recess.

The process sequence for probe manufacture is:

1. A double side polished silicon {100} wafer of a well-defined thickness is covered with a 1 μm thick silicon dioxide layer. This is done by wet thermal growth.
2. The front side is chosen. On the front side the probe pattern is transferred to a photo resist layer with 1:1 photolithography. The pattern is aligned to the <110>-directions precisely to within fractions of a degree.
3. The photo resist pattern is transferred to the front side silicon dioxide by means of an anisotropic reactive ion etching. Afterwards the photo resist is stripped.
4. The wafer is covered with a thin layer of low-stress silicon nitride by means of low pressure chemical vapor deposition.
5. On the backside of the wafer, the backside pattern is transferred to a photo resist layer with 1:1 photolithography. This backside pattern is carefully aligned to the front side pattern in a mask aligner. The backside pattern defines the outline of the probe chips taking into account that the backside outline and the front outline of the individual probes will differ in size because of the consecutive KOH-etch that produces 35.2° angled side walls with respect to vertical, i. e. {111}-planes.
6. The backside pattern is transferred to the silicon nitride layer by means of an anisotropic reactive ion etching. The silicon dioxide layer immediately below the holes in the silicon nitride layer is etched away in a buffered hydrofluoric acid.
7. The wafer is etched in a warm, concentrated KOH-solution under careful and constant stirring. The KOH etches entirely through the wafer, thus defining the individual probe chips on the wafer. Due to the highly anisotropic etch rates in silicon, the chips get a characteristic "gold bar"-like shape.
8. The silicon nitride on the wafer front side is removed in a reactive ion etch. Immediately afterwards, the front side silicon is under-etched a few μm in an isotropic reactive ion etch. This provides a certain isolation of the front side pattern from the silicon base.
9. A gold layer of about 100 nm is deposited on the front side of the wafer by means of a physical vapor deposition technique; typically e-beam evaporation is chosen.

The probe may be a silicon chip having one or more freely extending cantilevers that are electrically conducting and with spacings of a few μm so that the probe may be used for making one- or multipoint resistance measurements in the microscopic regime. In order to handle the probe in a practical situation, it has to be mounted on a larger substrate that has a high degree of mechanical stability. The substrate fits mechanically into the measuring head, which contains the necessary contacting and pre-amplification circuitry.

The idea behind the self-alignment is to exploit the nature of the {111}-planes of silicon. Since the sidewalls of the probe are 100% well defined with respect to each other, these sidewalls are contemplated to fit perfectly into a grave that has the same angling of its sidewalls, i.e. by means of KOH-etching in a silicon {100}-wafer, we can make a grave with an outline that fits exactly to the imprint of the bottom of a probe. This grave will be referred to as a probe receptacle.

Figure 6:
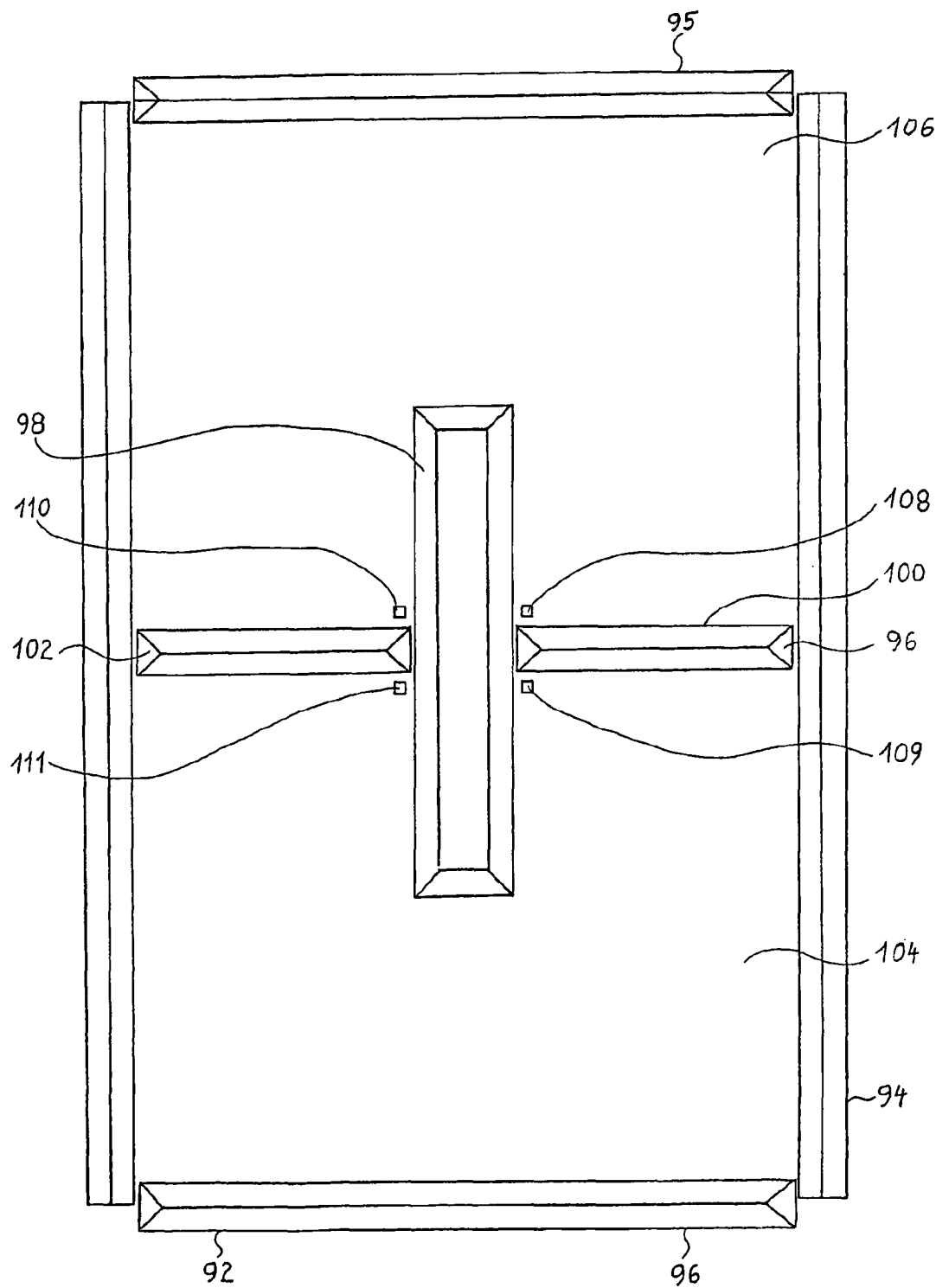
FIG. 6 is a schematic view of two supporting substrates.

The process sequence for substrate manufacture is:

A. A single side polished silicon {100} wafer of a well defined thickness is covered with a thin layer of low stress silicon nitride layer, typically 100-125 nm. This is done by means of low-pressure chemical vapor deposition.
B. The front side of the wafer is covered with a positive photo resist. On the front side the substrate pattern is transferred to the photo resist layer using 1:1 photolithography. The pattern is aligned to the <110>-directions precisely to within fractions of a degree. The pattern layout is summarized in FIG. 6. The layout in FIG. 6 defines a double set of substrates 104, 106. Every layout element within the white thin solid line 92 is repeated as a rectangular array throughout an area on the photolithographic mask that corresponds to the available wafer 112 area. This is illustrated in FIG. 7. The photo resist is illuminated in the black 94, 95, 100, 102, 108, 109, 110, 111 and chessboard-patterned rectangles 98. After development of the photo resist, all white regions will be covered by photo resist.
C. The photo resist pattern is transferred to the front side silicon nitride by means of an anisotropic reactive ion etching. Afterwards the photo resist is stripped. At this stage, we have acquired rectangular holes in the silicon nitride layer corresponding to all the areas 94, 95, 100, 102, 108, 109, 110, 111 and rectangles 98 in FIG. 6.
D. The wafer is etched in an 80° C. warm, concentrated KOH-solution under thorough and constant stirring. The KOH will only attack those parts of the front side of the wafer that are not covered with silicon nitride. This process is stopped, when the KOH has etched entirely through the wafer in those pattern elements that form the probe receptacles.
E. After rinsing and drying, the wafer has a grooved structure defined by FIG. 6 (detail) and FIG. 7 (rectangular array of the detail in FIG. 6). Now, the white area represents the wafer front side. The rectangle 98 in FIG. 6 corresponds to a region, where the KOH has etched entirely through the wafer. This region 98 defines the bottom of the receptacles of two semi-detached probe substrates 104 and 106. The white dotted lines 96 represent the line segments where two neighboring {111}-planes adjoin. With reference to FIG. 6 they will always adjoin along vertical or horizontal lines at the bottom of a groove, whereas the 45° angled lines always represent side edges of the groove. The four quadratic etch pits 108, 109, 110 and 111 are used as alignment marks. Also, the vertical rectangles do not have side edges (45° lines). This is because these rectangles continue all the way through the cell layout. In this way they will "melt together" with the similar rectangles from the vertically neighboring cells. The resulting vertical rectangles will extend all the way through the layout to be terminated at the two respective cells that define the vertical ends of the layout.

F. The wafer is easily broken into substrate wands by breaking along the through-going vertical grooves 94. The wands are then broken into individual substrates by breaking carefully along the horizontal grooves 100 and/or 102. The overall way of breaking is similar to the way in which you would break a groove-patterned plate of chocolate into regularly formed pieces. Alternatively, the wafer may be subdivided by techniques commonly known as dicing.

FIG. 6 illustrates a detail of the pattern layout as seen from the front side of the wafer. The entire pattern within the thin solid white lines is repeated vertically and horizontally in a rectangular array limited by the wafer size as illustrated in FIG. 7. The black and chessboard-patterned rectangles represent the areas where the positive photo resist is illuminated.

These regions will subsequently be etched in KOH. After KOH-etch, the black areas 98 represent {111}-planes bounding the etch grooves. These planes adjoin along the dotted lines 96. After KOH-etch, the chessboard-patterned rectangle 98 represents the bottom of two probe receptacles. This pair of probe substrates 104, 106 is turned into two individual substrates by breaking along a horizontal line parallel with the two minor, horizontal grooves 100, 102 in the middle of the layout. The way of breaking is similar to the way in which you would break a groove-patterned plate of chocolate into regular pieces.

The edges of the final substrate are defined by nature's geometry. Thus, edges that are perpendicular to each other make angles of exactly 90.0° whereas edges that are parallel with each other are in fact truly parallel. Consequently, the substrate can be fit exactly parallel with the side edges of a matching slot in the measuring head.

FIG. 7 schematically illustrates the pattern layout from FIG. 6 repeated 84 times and distributed on the available area of a 6" wafer.

Figure 8:
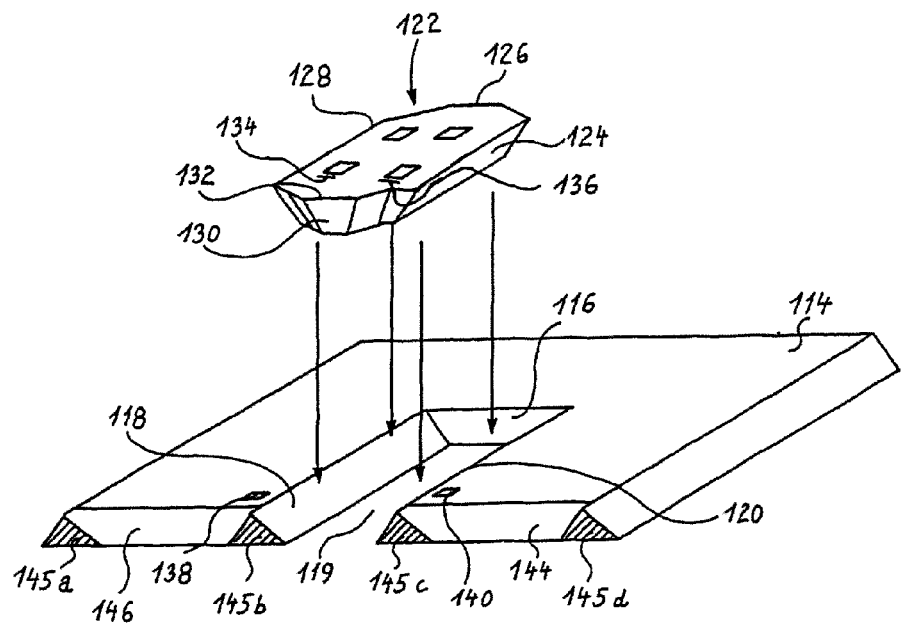
FIG. 8 is a schematic illustration of a probe and a supporting substrate including a recess.

FIG. 8 is a schematic, perspective view of a probe 122 and a probe supporting substrate 114. In the probe supporting substrate 114 a recess is formed. The recess is defined by the back wall 116, the two side walls 118 and 120, and the bottom 119.

The side walls 118 and 120, along with the end wall 116 have been formed by etching with a specific etching reagent. The etching reagent may be KOH or another etch reagent.

The probe 122 includes side walls 124 and 128 and an end wall 126. The side walls 124 and 128 define angles with the planar top surface of the probe 122 that are supplementary with the angles that the side walls 118 and 120 define with the top surface of the base 114 and similar with the bottom 119. As the angles are supplementary, the probe will align with the substrate 114 when the probe is inserted or positioned in the recess. The probe 122 may be placed mechanically, i.e. by a precession machine, or by an automatic placement method.

At the end 130 remote from the end wall 126 of the probe 122, one or more probe arms 132 may extend. The probe arms 132 may be used to perform measurements of electrical, and other, properties of test samples.

The probe 122 may further comprise one or more pairs of alignment marks 136 and 134, on the top surface of the probe 122. The alignment marks may assist in verifying that the probe 122 is placed correctly in the recess. Corresponding alignment marks 138 and 140 may be formed, or by other means provided, in the top surface of the supporting substrate 114.

FIG. 8 is a schematic illustration of a side view from above showing the self-alignment substrate and how to fit the probe down into the receptacle. The right and the left sides of the substrate are bounded by edges that are strictly parallel to each other and also strictly parallel to the probe-aligning receptacle, The backside of the substrate is mostly defined by an edge that is strictly perpendicular to the right and left edges.

In FIG. 8 the substrate is illustrated from a side view slightly above the surface. The sidewalls 116, 118, 120 of the substrate are not vertical but define an angle of 35.20 with the vertical direction, due to the crystalline structure of the material.

The front end of the substrate has four triangular facets 145*a*, 145*b*, 145*c*, 145*d*. These facets 145*a*, 145*b*, 145*c*, 145*d* appear due to breaking or dicing of the substrate pair in FIG. 6 into two halves and consist of the silicon that will remain after etching of the grooves. The facets 145*a*, 145*b*, 145*c*, 145*d* may protrude a little, but this is contemplated to have no significance.

In the middle of the substrate, the self-alignment groove, being the probe receptacle, is illustrated. The two holes 138, 140 on each side of the probe receptacle near the front end of the substrate serve as positional alignment marks.

In the top part of FIG. 8 the probe 122 is shown. The arrows indicate the movement of the probe 122 down into the receptacle. A slight uncertainty in the positioning along the substrate front, i.e. along a line parallel with the wall 116, may be accepted. This is because as the probe enters into receptacle it will eventually meet one of the sidewalls 118 or 120 of the receptacle. Pushing the probe 122 further down will simultaneously force it sideways into alignment with the outline of the receptacle.

Figure 9:
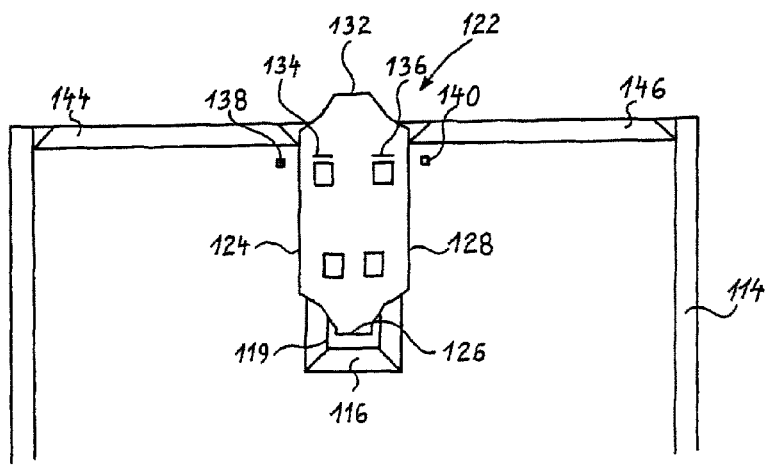
FIG. 9 is a schematic top view illustrating the probe and supporting substrate of FIG. 8.

In FIGS. 8 and 9 the electrical pathways on the probe surface are omitted and only the pads are illustrated.

A bottom wall 119 may be formed in the bottom of the recess or receptacle depending on the thickness of the starting material, i.e. the substrate 114, and the time used for etching the recess. It is preferable that the bottom of the probe is not in facial contact with the bottom wall 119. In one embodiment of the recess, the bottom wall 119 may be nonexistent, meaning that the recess is open in a downward direction in relation to the set-up of FIG. 8.

FIG. 9 is a schematic top view of the set-up of FIG. 8. The probe 122 has been placed above the recess of the substrate 114. The back wall 126 of the probe 122 is not in facial contact with the back wall 116 of the substrate 114. In alternative embodiments, the back wall 126 and the back wall 116 may be in facial contact. The bottom of the probe 122 is not required to be in facial contact with the bottom wall 119 of the recess. Illustrated in FIG. 9 the "bottom" 119 is not present. In alternative embodiments, the bottom 119 may be present depending on the thickness of the substrate 114 and the time used for etching the recess, and also on the concentration of the etchant. It is preferable that the bottom of the probe is not in facial contact with the bottom of the recess in the substrate.

The alignment marks 134 and 136 are positioned in alignment with the alignment marks 138 and 140 on the surface of the substrate 114.

The surfaces 144 and 146 have been formed by etching. The surfaces have formed a recess constituting a weakening of the wafer from where the supporting substrate was formed. The weakening facilitated a separation of the individual supporting substrates.

The probe fits into the receptacle and is positioned correctly with respect to the alignment marks 138, 140. The only job for the alignment marks 138, 140 is to ensure that the contact pads of the probe be in position with the subsequently fitted contacting socket of the measuring head. The other issues of alignment, i.e. minimum tilt and minimum rotation, are taken care of due to the self-alignment. The probe 122 front surface is plane parallel with the substrate 114 surface, and the probe length axis is parallel with the substrate symmetry axis.

The region 119 is the bottom of the probe receptacle. The two holes or etch pits 138, 140 serve as positional alignment marks. The contact pads must be positioned with a certain care relatively to the receptacle. For this purpose, the probe 122 also contains one or two pairs of horizontal line segments 134 and 136. In FIG. 9, these pairs of line segments 134, 136 have been used to align the probe in the vertical direction. The positional uncertainty with this technique may by as much as 20 μm without affecting the subsequent contacting of the probe 122 to the measuring head.

This active positional alignment is not a required issue but an option. Since the distance from the positional alignment marks is defined from the layout of both the probe and the substrate it is possible to shorten the length of the receptacle (decrease the black area in FIGS. 6 and 9), so that the back end 126 of the probe 122 will be pushed along the probe length axis. In this way the probe 122 will be pushed into alignment in a passive manner in both planar directions when pushed down into the receptacle. This passive alignment along the length axis is contemplated to be a bit more uncertain than the active alignment since the sidewall of the probe back end does not define a 35.2° angle with vertical but rather an angle close to 0° to within a few degrees. Thus, the passive alignment along the length axis might require a change in the layout of the probe contact pads.

Now, the probe 122 is fit into the receptacle. The width of the receptacle is sufficiently narrow so that the probe will not be in facial contact with the bottom. In this way, the probe 122 is held in place entirely because of the contact between the probe sidewalls 124, 128 and the receptacle sidewalls 118, 120. The sidewalls are not perfectly plane but may have a surface roughness somewhat around 1 μm or below. This has no significance once the probe is fit, but it may imply a relatively low limit to the allowable tilt of the probe 122 during the probe mounting procedure.

No matter how small the surface roughness of the {111}-planes that make out the sidewalls of the probe 122 and the receptacle, the fitted probe 122 will be easily fixed using a slight pressure on the front side of the probe 122 body. The mass of the probe 122 is, in a presently preferred embodiment of the invention, approximately 4 mg giving a gravitational pull in the probe of around 40 μN. In a measuring situation, the cantilevers of the probe are forced into contact with the sample to be measured with a force summing up to within the range of 4-40 μN.

By pressing very modestly on the front surface of the probe 122 with a macroscopic tool, a force of the order of magnitude of 1 N ensures that the probe 122 be held in place due to the resulting frictional force between the probe sidewalls and the receptacle sidewall. Thus, the probe 122 will not need to be glued in any sense. On the other hand, front surface pressure must not be too high as to fix the probe 122 irreversibly into the receptacle. Presently, the allowable limits of this fixation pressure have not been established, but the idea and problem regarding the fixation pressure is similar to the craft of correctly fitting a revolving live center into the tailstock of a machine tool.

Figure 10:
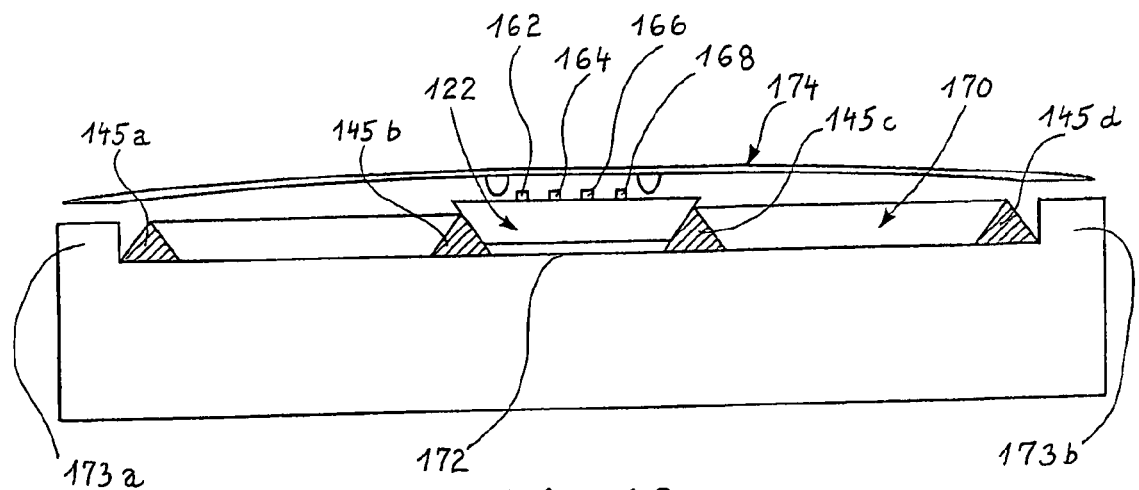
FIG. 10 is a schematic view of a probe mounted in a measuring set-up.

Sufficient fixation of the probe in accordance with the above-mentioned considerations is illustrated in FIG. 10. Here, the probe is illustrated from the front side wall—confer FIG. 8. The aligning substrate is mounted into the relevant part of the measuring head, where its two parallel side edges fit exactly into the measuring heads frame so that rotation of the substrate is impossible. In a true measuring situation, the measuring head with substrate and probe will be turned upside down so that the probe could fall out. This is, however, not an issue due to the flex print necessary for contacting. To ensure proper, electrical connection between the flex print contact pads and the respective probe contact pads, a minimum amount of mechanical force must be exerted by means of the locking guide of the flex print.

The locking mechanism for the locking guide can be obtained by any commercially available method that fulfils the requirements to the force exerted on the front side of the probe and at the same time allows positioning of the flex print contact pads within 20 μm. The locking mechanism must not contain magnetic parts.

In FIG. 10, detail of the probe 122 mounted in a measuring head is viewed towards the front side of the probe 122. The probe 122 itself has four cantilevers 162, 164, 166 and 167 pointing directly towards the observer. The probe 122 fits in the receptacle of the aligning substrate 170. The probe 122 is too wide to be able to be in facial contact with the bottom 172 of the receptacle. Thereby a gap is defined in between the probe and the bottom 172. The bottom 172 may be visible through 119 of FIGS. 8 and 9. The substrate 170 fits exactly between the parallel frame jaws 173a and 173b of the relevant part of the measuring head. The final fixation of the probe 122 is activated by a contacting flex print 174 being attached, pressing gently on top of the probe 122.

So far, it has been assumed that the substrate 170 itself is fixed in a measuring head. However, the substrate 170 is still a necessary part of the entire alignment issue. By inspection of FIG. 6 and FIG. 10 it appears, that the width of the substrate is defined by the original CAD-layout of the photolithographic mask for substrate manufacture.

In practice, there is a certain uncertainty on the width of the final substrate as well as on the width of the receptacle and on the probe width. This is because the KOH-etch rate in the <111>-directions is not exactly zero, and because of the small uncertainties in the alignment to the silicon crystal axes. Consequently, the substrate frame in the measuring head should have a flexible width.

The simplest, and best, way to handle this in practice is to fix one of the frame jaws, say the right one 173b. Then, the left jaws 173a can be displaced to the left and to the right relative to the direction in FIG. 10. Near the two ends of the left frame jaw 173a it is attached to the main part of the measuring head by two guided springs.

Mounting of a substrate is done by turning the measuring head upside down (as in FIG. 10), and pulling the left jaw 173a to the left. The substrate 170 is laid gently on the flat plane of the measuring head. The left jaw 173a is slowly released, whereby the substrate will be fixated. The opposite side of the substrate, i.e. the region of the substrate opposite to the receptacle, is large enough to allow a similar fixation normal to the substrate surface.

As mentioned above, during a measurement the probe in the substrate will turn upside down with respect to the orientation in FIG. 10. The measuring situation is sketched in FIG. 11.

Figure 11:
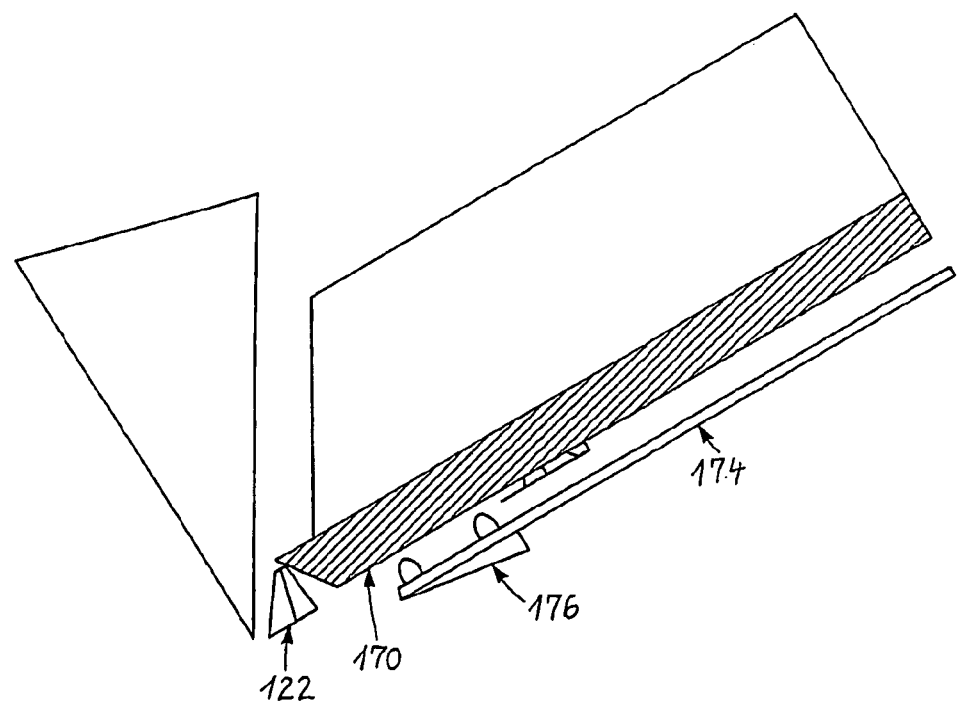
FIG. 11 is a schematic view of a probe mounted in the measuring set-up of FIG. 10.

FIG. 11 is a schematic side view of the measuring situation. The probe 122 turns upside down with respect to FIG. 10. The probe 122 defines an angle with the surface of a test sample of typically 30°. The measuring angle provides space for the flex print 174 and its locking guide 176. The entire measuring head with mounted probe 122 is designed to allow a view of the probe cantilevers both perpendicularly and from a vertical direction.

The design of the measuring head must anyway leave space for the fixation mechanisms, contacting mechanisms and any optical recognition systems. The probe is typically approached to a sample surface with an angle of 30° but smaller angles might be needed in certain applications; in the latter case, the design of probe as well as substrate may simply be elongated to allow for smaller approach angles. The front end of the measuring head has a "sharpened" shape in order for the probe to be visible for the various possible optical detection systems.

As mentioned previously, the gravitational force trying to pull out the probe in FIG. 11 is a few μN, and, when approaching the probe to the sample, the slight bending of the cantilevers sums to a similar amount. The torque resulting front the cantilever bending force should be included since this force attacks at a distance of about 1.5 mm from the probe body center. However, the rear most set of flex print contact pads are displaced approximately 0.5 mm in the opposite direction, so it is contemplated that the torque resulting from the contact pad force on the probe body relates to the cantilever bending torque more or less like the contact pad force relates to the cantilever bending force.

Thus, once the probe is mounted, the measuring may be performed with the angular alignment of the probe in a contemplated improved manner.

Any kind of SPM-probe will wear and eventually stop functioning. At this stage, the probe is typically intact from a mechanical point of view. Consequently, there should normally be no need for changing the substrate when changing the probe. To remove the probe, one will release the measuring head and turn it with the probe facing upwards and release the guided flex print. Now, the probe will typically fall out if the measuring head is turned upside down, due to gravity. This is true if the force exerted by the flex print has not been too high. If however, the probe does not fall out by itself, place the measuring head with the probe turning upwards and then push it gently with set of tweezers or a similar tool.

The positional alignment marks on the probe and on the self-alignment substrate further allows the probe to be positioned in the receptacle in exactly the same way; it would be handled in a commercial bonding tool.

Figure 12:
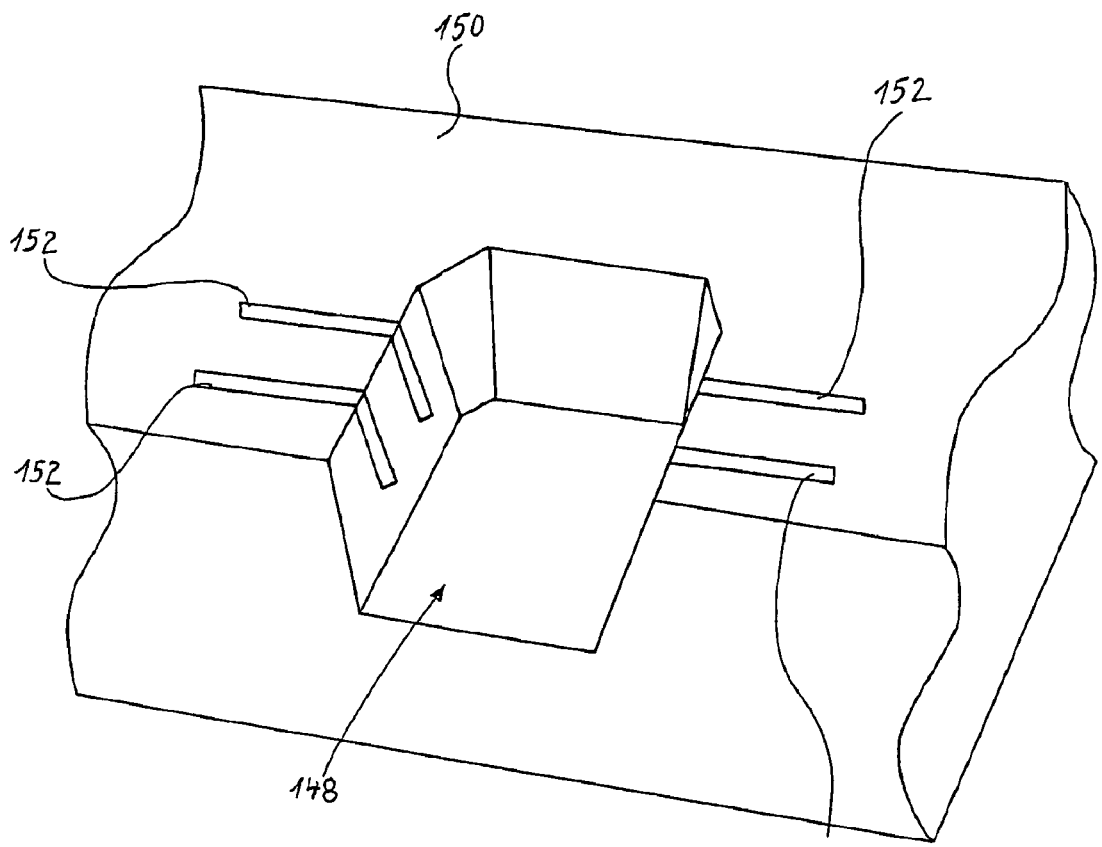
FIG. 12 is a schematic view of a substrate and a recess including electrical conductive paths.

FIG. 12 is a schematic illustration of an alternative embodiment of a recess 148 formed in a substrate 150. The recess 148 is adapted for receiving a probe, as described in connection the FIGS. 6-11 . The recess 148 includes four electrically conductive paths, all designated by the reference numeral 152, for establishing electrical connections between the probe and a measuring apparatus. The electrically conductive paths 152 may be established on the substrate 150 after the formation of the recess 148, e.g. by depositing electrically conductive material onto the surface and the side walls constituting the recess 148.

Figure 13:
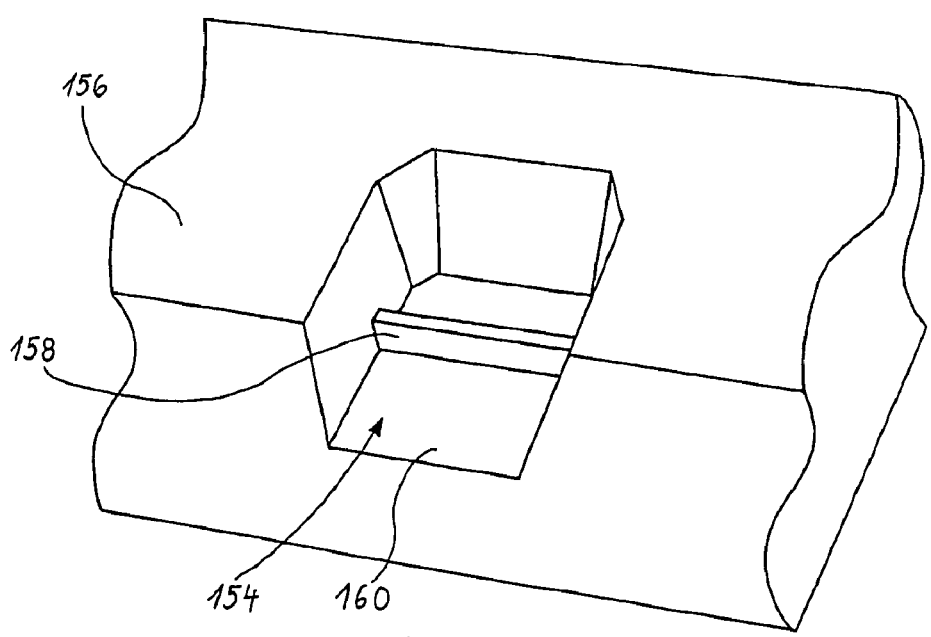
FIG. 13 is a schematic view of a substrate and a recess including a protruding part.

FIG. 13 is a schematic illustration of a further alternative embodiment of a recess 154 formed in a substrate 156. The recess 154 includes a protruding part 158 formed on or in the bottom 160 of the recess 154. The protruding part 158 is here illustrated having a truncated triangular cross-section, but may, in further alternative embodiments, define a rounded cross-section, a square cross-section, a rectangular cross-section, a triangular cross-section, any polygonal cross-section or any combination thereof.

The protruding part 158 may be formed in the bottom wall 160 by applying a mask after forming a part of the recess 154. The mask may then define an area where the bottom 160 is exposed. This exposed area of the bottom 160 is then exposed to an etch reagent, etching away material of the substrate, thus leaving material constituting the protruding area 158.

A co-operating recess may be formed in the probe to be received within the recess 154. These recesses are contemplated to increase the alignment and mechanical stability of the probe and substrate assembly.

The protruding area 158 is illustrated as being linear, i.e. extend substantially perpendicular to the side walls of the recess 154. However, the protruding part may define any geometry, i.e. include turns or define a non-linear geometry, such as curved, circular, semi-circular, polygonal or any combinations thereof.

Further alternatively, protruding parts may be formed in one or more of the side walls of a recess.

Even further alternatively, the above description may be negated, i.e. the protruding parts may be recesses and the recesses may be protruding parts, viz. a protruding part may be formed on the probe while a corresponding recess may be formed in the recess receiving the probe.

Figures 14A, 14B, 14C, 14D:
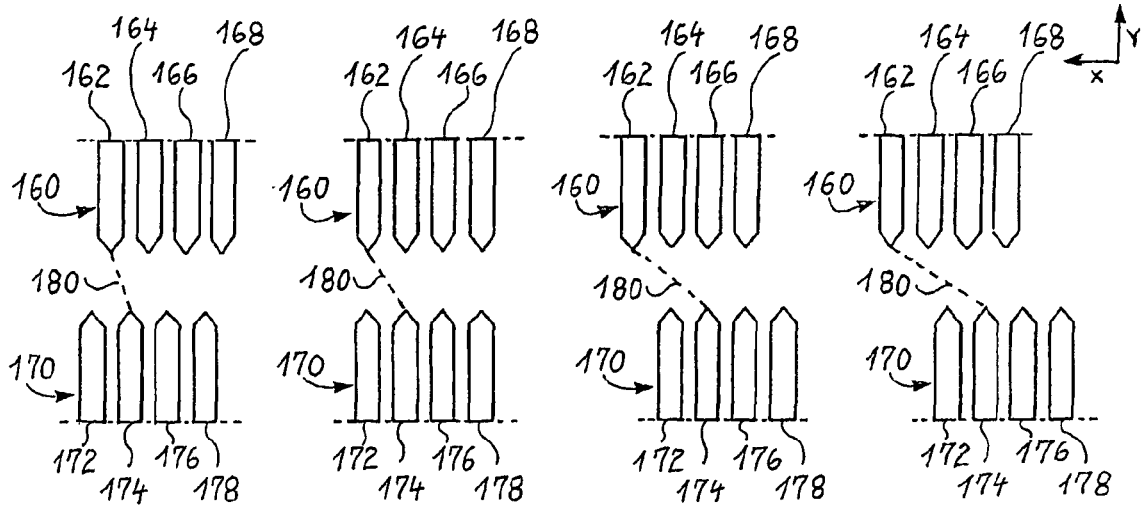
FIGS. 14a to 14d are schematic view of a test configuration comprising two multi point probes including movement.

FIGS. 14a to 14b schematically illustrate a system comprising two multi-point probes 160 and 170. Each of the probes 160 and 170 comprises four probe arms, designated 162, 164, 166, 168, 172, 174, 176 and 178, respectively.

A test sample is provided and one or more of the probe arms are brought contact with the test sample. The test sample is not illustrated in FIGS. 14a to 14d. The test sample is in FIGS. 14a to 14d considered as being placed in the plane of the paper. An x-y co-ordinate system is defined relative to the test sample, and/or the paper. In FIGS. 14a to 14d only motions in the x-y plane is illustrated, however, movement in all directions or dimensions, i.e. x and/or y and/or z, is possible.

The probes 160 and 170 are cantilever type probes, but other types of probes may be used. The cantilever type probes are preferably micro-fabricated cantilever electrode arrays made with Micro-Electro-Mechanical-System technology (MEMS).

In the sequence illustrated in FIGS. 14a to 14d, the probe 160 is moved parallel to the probe 170. The illustration indicates a movement in substantially one direction or dimension; however, measurement sequences involving movement in more dimensions or directions may be envisioned and implemented. The probes may be positioned with sub-micron resolution to parallelogram configurations by using piezo-electric actuation, and other sub-micron movement technology or techniques may alternatively be used.

In the test machine in FIGS. 14a to 14d a signal is applied to one probe arm 162 and the probe arm 174 is used to measure the received signal. The signal is contemplated to propagate through the test sample. Also, more than one probe arm on the probe 170 may receive or detect the signal after propagation through the test sample; further, probe arms on the probe 160 may be used to detect the test signal.

The propagating test signal is illustrated by the punctuated line 180. The signal propagating in a test sample may propagate via a path different from a straight line.

The movement enables a characterization of the electrical properties of an area of the surface of the test sample.

As the probe 160 is moved in a controlled way relative to the probe 170, the variations in the measurements are recorded and analyzed. The analysis may be performed by either the test machine or a computing device attached to or in connection with the test machine.

The analysis is contemplated to provide information regarding anisotropy and electronic transport properties of the material or device under test.

The speed at which the probe 160 is moved relative to the probe 170, is preferably constant, but may be varied during the measurement. Alternatively, a series of measurements may be performed at specific locations, i.e. measurements are performed while the probe 160 is not moved relative to the probe 170.

The tests performed on a semiconductor device may be circuit tests, conductivity tests, resistance tests or any other electrical properties or characterization tests or combinations and/or variations thereof. Furthermore, a magnetic field may be applied over or to the sample, preferably in a direction substantially perpendicular to the plane defined by the surface of the test sample, with the magnetic field direction being either away or towards the surface of the test probe. The application of a magnetic field is contemplated to enable measurements or determination of characteristic electrical properties using or utilizing the Hall-effect.

Figures 15, 16:
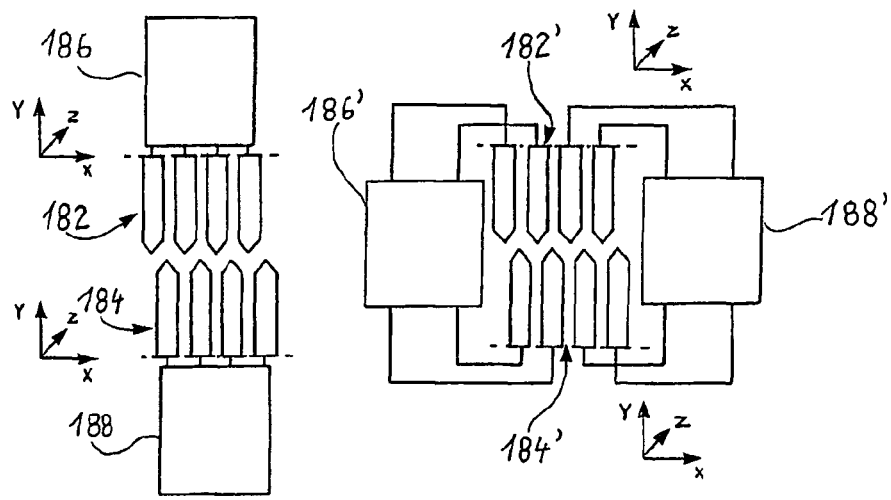
FIG. 15 is a schematic view of a test configuration comprising two multi-point probes.
FIG. 16 is a schematic view of a different test configuration comprising two multi-point probes.

FIG. 15 is a schematic view of a system comprising two multi-point probes, 182 and 184. The probes 182 and 184 are movable in three dimensions, as indicated by the two co-ordinate systems.

The probes 182 and 184 are each electrically connected to a respective multiplex unit 186 and 188 for allowing electrical connection to one or more electrodes on one or more probe arms at any given time. The multiplex units 186 and 188 allow transmission of any type of signals, such as AC, DC or HF signals.

The set-up illustrated in FIG. 15 is used for both resistive and capacitive measurements. The measurements are performed by applying test signals, i.e. constituted by AC or DC currents, alternatively by HF signals. The signal is applied to one, alternatively more, probe arms of one of the test probes, i.e. probe 184.

The signal measured, recorded, collected or received is then processed to obtain the desired information. In the case where AC or DC signals are applied, the current and the voltage are measured or determined; hereafter, the resistance and/or capacitance is calculated. The signal is recorded or detected at any of the remaining electrodes of any of the remaining probe arms, dependant on the desired configuration.

The HF signals are processed using signal processing such as FFT or other, preferably digital, signal processing schemes algorithms. The processing is performed in a digital signal processor, or alternatively in analogue signal processing equipment.

In another embodiment, the test sample includes a multitude of electrode pads, the position of the probes 182 and 184 is adjusted to align with one or more of the electrode pads, and the controlled interrelated movement or positioning of the probes is then contemplated to provide information regarding the performance of the device under test, preferably being a semiconductor device including circuitry, such as an ASIC, FPGA, SOC or other similar device.

Further, multiplexing devices may be employed for the independent control of the electrical connections to each of the electrodes of the test probes, i.e. in the set-up including a plurality of test probes control is obtained over each of the electrodes. This multiplexing device is contemplated to enable electrical tests with different spatial electrode configurations, thereby increasing the accuracy of material tests. Providing a test sample with known properties, such as a test sample having well-known circuitry electrical pad configurations, enables calibration and alignment of the multi-point probes, preferably being two or more.

Current and voltage are monitored as a function of the distance between the two probes when performing measurements calibration.

The probes are brought into contact with the test sample while electrical signals are transmitted from one or more of the electrodes and recorded, received or detected via one or more of the remaining electrodes as a function of the interrelated position of the probes. The controlled interrelated movement of the test probes then provides information about the alignment of the electrodes, automated calibration and alignment of the probes may then be performed.

FIG. 16 is a schematic view of an alternative test set-up where the probes 182' and 184' are electrically connected via multiplex units 186' and 188'. The alternative set-up illustrates the possibility to apply a test signal to one or more electrodes of either one or more of the test probes electrodes. It is then possible to apply a test signal to e.g. two of the probe arms, one on each of the test probes.

Further, it is possible to conduct several, two or more, measurements at the same time using different or same probe arms by using multiple or several signals each being substantially limited to its own frequency band.

Figure 17:
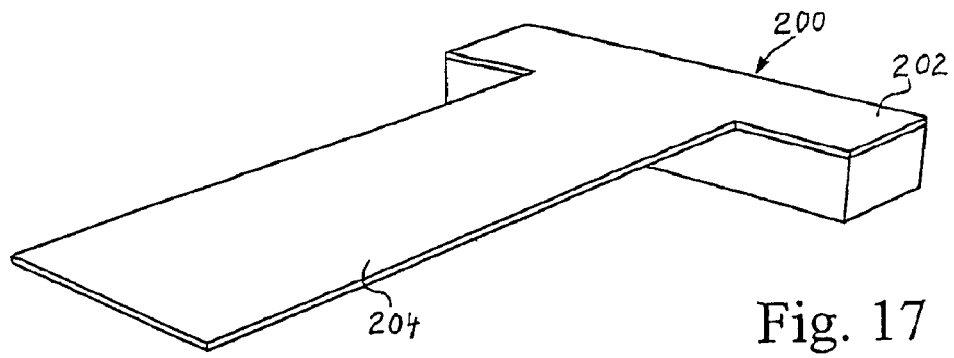
FIGS. 17-25 are schematic views of alternative embodiments of probes.

FIG. 17 is a schematic view of an alternative embodiment of a probe 200. The probe comprises a base part 202 and a cantilever 204 extending from the base 202. The cantilever 204 is rectangular and has substantially the same thickness across the entire cantilever 204.

The probes illustrated in the FIGS. 17-25 comprise a supporting base part and a single substrate forming the cantilever part and a part connected to the base part. The supporting base and the substrate may be formed from identical materials or different materials.

Figure 18:
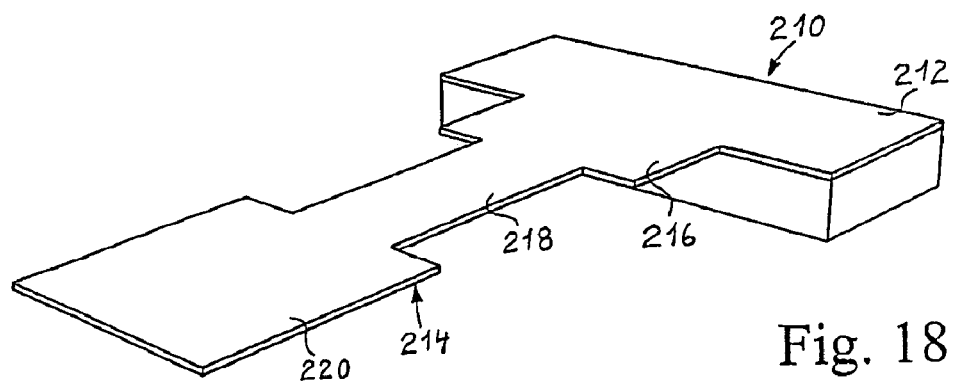

FIG. 18 is a schematic illustration of a probe 210 comprising a base part 212 and a cantilever part 214. The cantilever part extends from the body 212 and includes areas 216, 218 and 220. The width of the area 218 is smaller than the width of the area 216 and 220, respectively. The decreased width of the area 218 compared to the areas 216 and 220 is contemplated to give the cantilever part 214 greater flexibility. The width of the areas 216 and 220 is illustrated as being substantially equal.

Comparing the flexibility of the probe 200 illustrated in FIG. 17 and provided the overall length of the cantilever parts 204 and 214, respectively, are substantially equal, the probe 210 provides greater flexibility as indicated in table 1.

Table 1 shows the degree of movement along a longitudinal center axis of the cantilever parts of the probes as illustrated in the FIGS. 17-25 when a force of 5 or 10 micro Newton, respectively, is applied to one of the corners of the distal end of the cantilever parts of the test probes.

Table 2 shows the spring constants of the probes illustrated in the FIGS. 17-25.

TABLE 2

| Probename | Spring constant/(N/m) |
|---|---|
| Probe200 | 0.81 |
| Probe210 | 0.50 |
| Probe222 | 0.40 |
| Probe234 | 0.22 |
| Probe252 | 0.17 |
| Probe264 | 0.33 |
| Probe280 | 0.28 |
| Probe290 | 0.06 |

TABLE 1

|  | UpperZ/μm | LowerZ/μm | Angle/degree | Force/μN |
|---|---|---|---|---|
| Probe200 | 54.58 | 53.63 | 1.360902694 | 5 |
| Probe200 | 48.44 | 46.71 | 2.478815092 | 10 |
| Probe210 | 51.31 | 49.92 | 1.991429077 | 5 |
| Probe210 | 42.40 | 39.75 | 3.798622703 | 10 |
| Probe222 | 47.72 | 45.97 | 2.507490091 | 5 |
| Probe222 | 36.03 | 32.78 | 4.660405799 | 10 |
| Probe234 | 40.21 | 37.61 | 3.726848698 | 5 |
| Probe234 | 27.43 | 23.25 | 5.998312245 | 10 |
| Probe252 | 34.79 | 31.47 | 4.761011744 | 5 |
| Probe252 | 22.42 | 17.56 | 6.978577604 | 10 |
| Probe264 | 47.43 | 45.36 | 2.966380202 | 5 |
| Probe264 | 35.65 | 32.00 | 5.235498446 | 10 |
| Probe280 | 45.21 | 42.88 | 3.339366856 | 5 |
| Probe280 | 32.62 | 28.59 | 5.782320515 | 10 |
| Probe290 | 19.55 | −6.71 | 19.14690626 | 5 |
| Probe290 | 7.03 | −21.09 | 20.55674872 | 10 |

Figure 19:
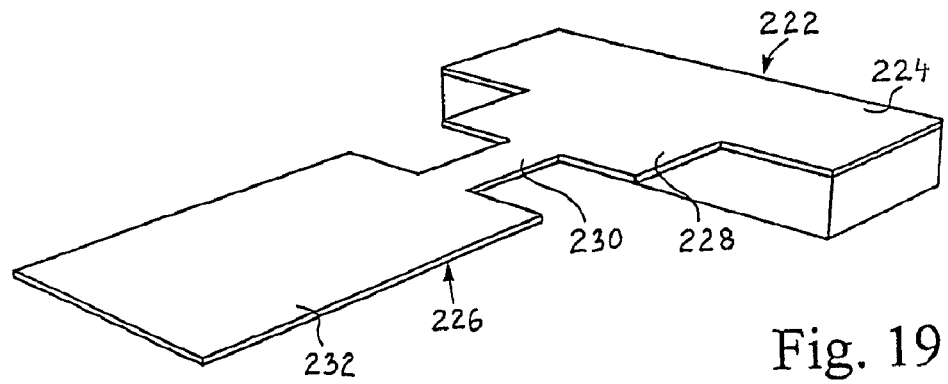

FIG. 19 is a schematic illustration of a probe 222 having a base part 224 and a cantilever part 226. The cantilever part 226 comprises three sections or areas 228, 230 and 232. Comparing the probe 222 to the probe 210 illustrated in FIG. 18, the area 230 is shorter and narrower than the area 218 while the area 232 is larger, i.e. longer and wider than the area 220. As seen from table 1, the probe 222 provides a greater flexibility than the probe 210.

Figure 20:
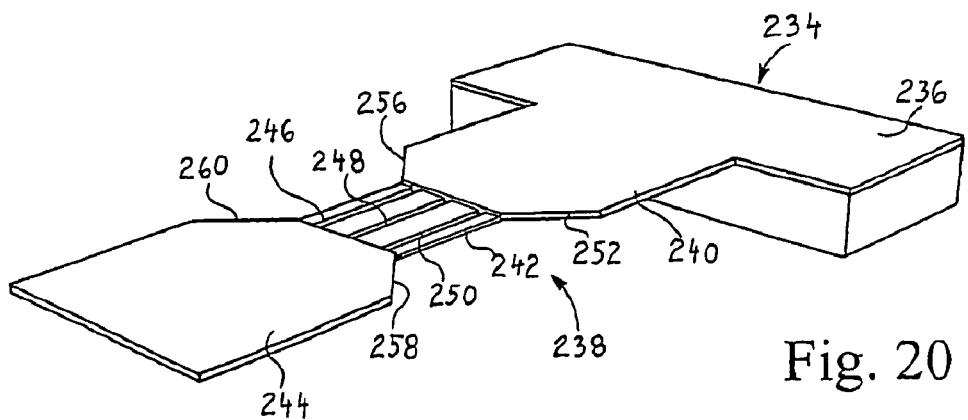

FIG. 20 is a schematic illustration of a probe 234 comprising a supporting body 236 and a cantilever part 238. The cantilever part comprises three areas or sections 240, 242 and 244. The middle section 242 comprises three apertures or openings 246, 248 and 250. The openings 246, 248, 250 are illustrated as rectangular openings extending along the cantilever 230. The openings 246, 248 and 250 may extend through the section 242 or may in the alternative extend partly through the section 242, thereby being constituted by roofs or trenches.

The section 242 is further illustrated as having a smaller thickness compares to the areas 240 and 244. Additionally, the areas 240 and 244 comprise angle sides 254, 256, 258, 260. The angle sides are contemplated to reduce the weight of the cantilever as well as provide improved flexibility of the cantilever 238.

In the present Figs., the middle sections as illustrated may be perceived as separate parts, however in the presently preferred embodiment the entire cantilever is constructed from a single unitary piece of material. The bars and apertures are preferably formed by etching the middle section of the cantilever parts.

Figure 21:
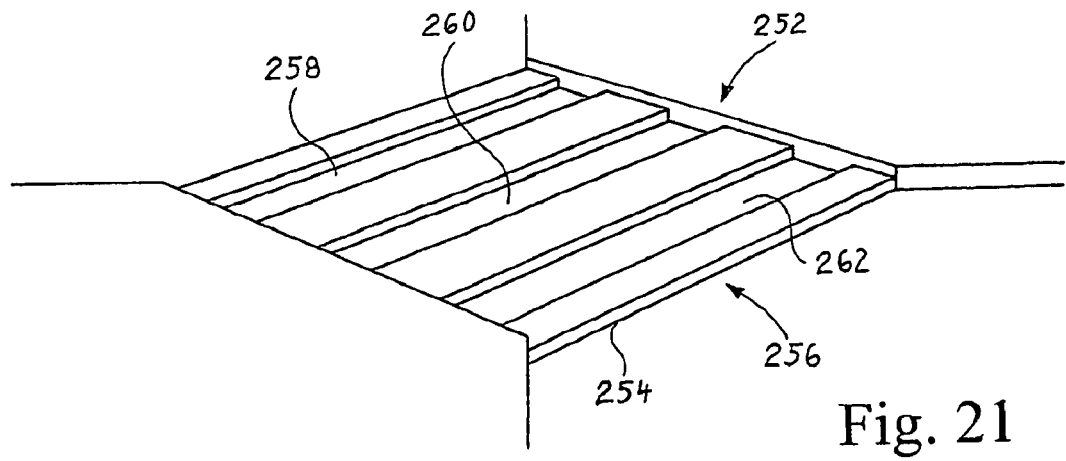

FIG. 21 is a schematic illustration of a probe 252 having a construction similar to that of the probe 234 shown in FIG. 20. However, the section 254 comprises larger apertures or narrower bars compared to the section 242 of FIG. 20. As seen in table 1, the probe 252 provides a greater degree of angular movement than the probe 234.

Figure 22:
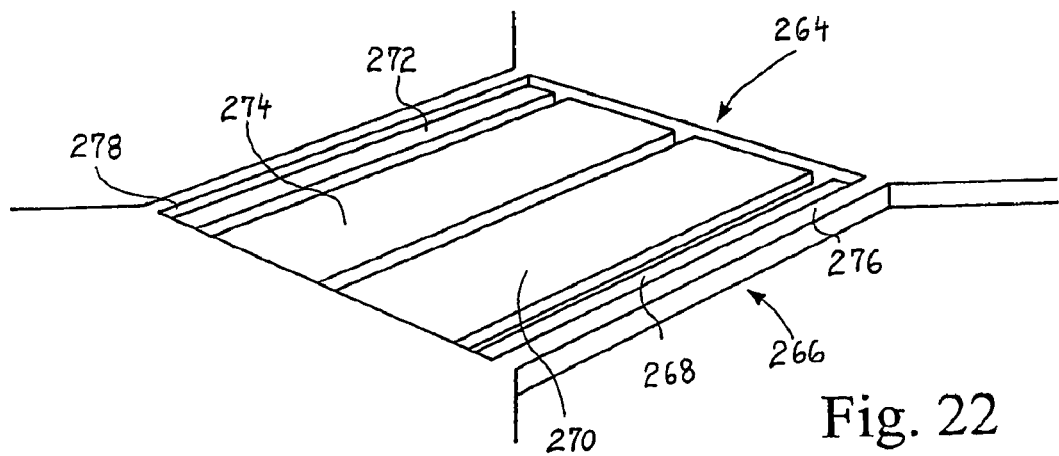

The probe 264 illustrated in FIG. 22 has a middle section 266 comprising two wide bars 270 and 274 and two smaller bars 268 and 272 along with two side bars 276 and 278.

Figure 23:
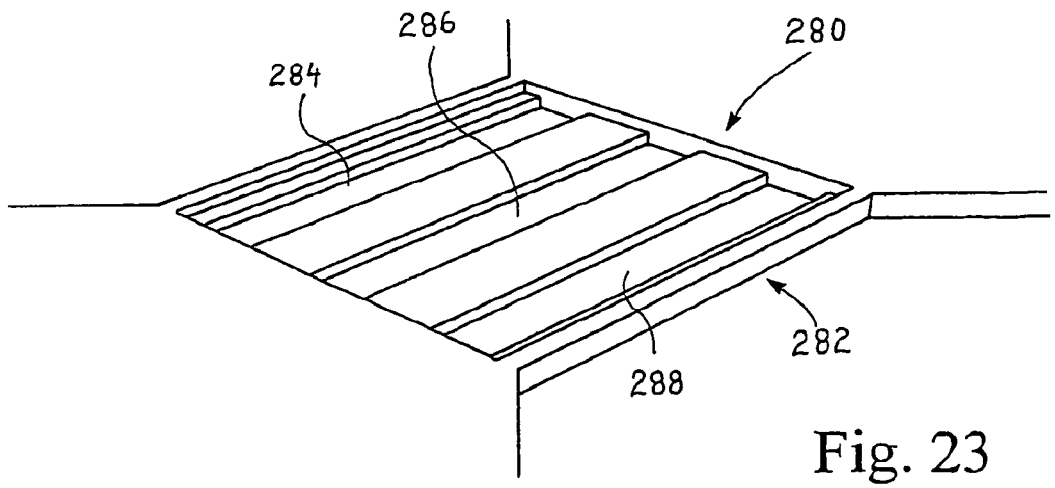

In the sides of the middle section 266 of the probe 264 the bars 276 and 278 form an L-shaped structure with the two smaller bars 268 and 272. The L-shaped structure has been shown to cause the probe to flex in a different point compared to the probes not having such as structure in the cantilever part. The edge or side of the middle section can be said to have an L-shaped cross-section or FIG. 23 schematically illustrates a probe 280 with a middle section 282 having three equally wide apertures 284, 286 and 288. The overall structure of the cantilever part is similar to that of the probe 264 of FIG. 22. The probe 280 has an L-shaped structure like that shown in the probe of FIG. 22.

Figure 24:
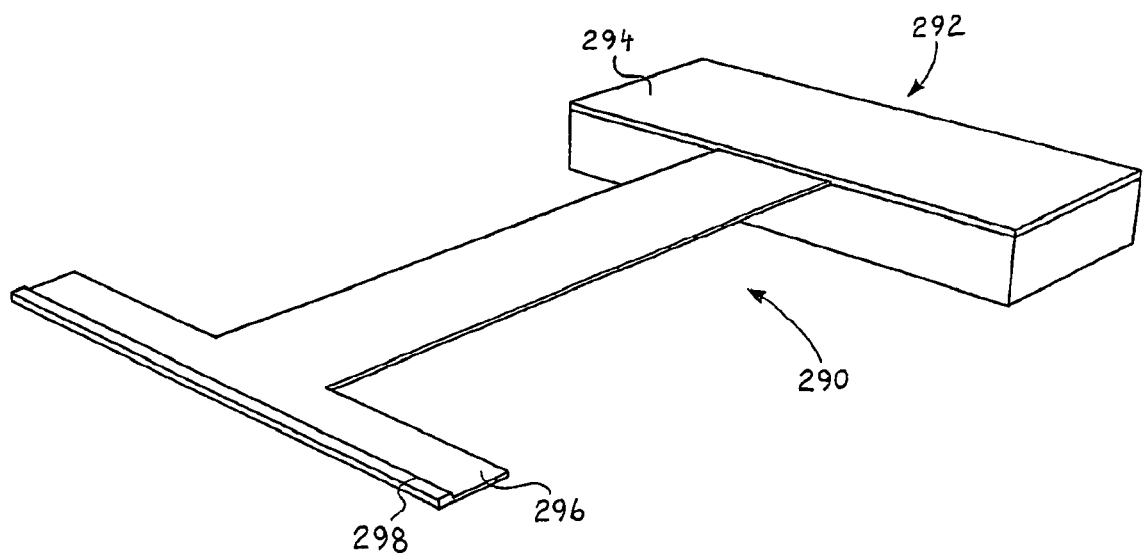

FIG. 24 is a schematic illustration of a probe 290 having a long cantilever part 292 extending from a supporting body 294. The cantilever 292 includes a head part 296 being wider than the cantilever part connecting the cantilever to the supporting body 294. On the edge 298 of the head 296 remote from the body 294 a pultruding part is formed. The part of the edge 298 provides additional weight to the cantilever head and, as is seen in table 1, the structure provides a large degree of movement compared to the other probes.

Figure 25:
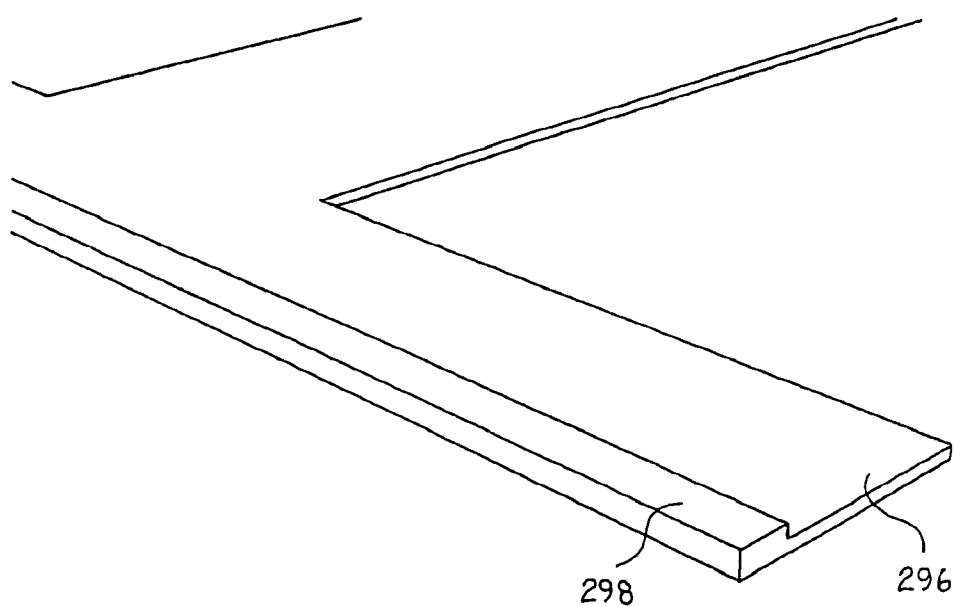

FIG. 25 is a zoomed view of a part of the probe 292 of FIG. 24.

It is to be understood, that the probe head or distal part of the cantilever of the probe illustrated in the FIGS. 24 and 25 may be combined with any of the other probe configurations illustrated and described in the present specification.

Table 1 includes simulation data from the probes as described in the FIGS. 17-24 and described above. The table includes results of applying a force of 5 or 10 micro Newton one side of the cantilever part of the probe. The results show the angular movement of the probes along with the movement in said direction.

The probes illustrated in the FIGS. 17-24 have been mentioned as having apertures, however, in further alternative embodiments the probes may have only partially etched areas so that the middle areas or sections define multiple areas with different thicknesses. These areas with different thicknesses are contemplated to give the probes, or at least the cantilever part of the probes, an improved flexibility.

In a test machine for testing electrical properties of test samples a traditional method for determining if the test probe has had sufficient electrical and mechanical contact with the test sample is to examine marks and tracks made in the test sample after pushing the test probe into or onto the test sample. Traditionally, the method involves moving the test probe into contact with the test sample and after the test probe has made contact with the test sample, the test probe is moved or pressed even further into the test sample thereby creating marks or tracks in the contact area of the test sample. A term sometimes used for this process is overdrive.

The marks and/or tracks are then inspected to evaluate the quality of the electrical contact between the test probe and the test sample. The evaluation is then only done after the test has been performed and the test probe has been moved away from the test sample, also, the evaluation is only done indirectly.

The probes and test machine described herein may be used for an alternative method of verifying, the electrical contact between the test probe and the test sample. The alternative method involved having two probe heads in contact with the test area, or each of the test areas, of the test sample thereby enabling a two-point measurement where the electrical resistance between the two test probe heads is a direct measurement of the electrical contact between the test probe and the test sample.

The determination of the resistance may include sending or transmitting an electrical signal trough one of the test probe heads in contact with the test area and sampling or measuring the resultant signal on the other test probe head. In alternative embodiments, more than two test probe heads may be in contact with the test area.

The electrical signal may be a DC signal or an AC signal and may be high or low frequency, such as HF or RF.

The present invention may incorporate any of the features of the following points characterizing the invention:
1. A probe for testing electric properties on a specific location of a test sample, comprising:

a supporting body defining opposite first and second parts constituting a flexible cantilever part being flexible in one direction and a base part respectively, the cantilever part defining an outer planar surface substantially perpendicular to the one direction, the base part being adapted for being fixated in a co-operating testing machine, at least one conductive probe arm in the cantilever part, each of the at least one conductive probe arm being positioned opposite the base part, the cantilever part defining opposite first and second regions, the second region being in contact with the base part, the first region defining first and second side surfaces, each of the first and second side surfaces defining a first angle with the outer planar surface, a first width defined between the first and the second side surfaces, the second region defining third and fourth side surfaces, each of the third and fourth side surfaces defining a second angle with the outer planar surface, a second width defined between the third and the fourth side surfaces, and the second width being equal to or smaller that the first width.

2. The probe according to point 1 wherein the first and second side surfaces being substantially parallel the third and fourth side surfaces being substantially parallel.

3A. The probe according to point 1 or 2, wherein the first angle is between 60 to 90 degrees the second angle is approximately 60 to 90 degrees and the first angle being identical to or different from the second angle.

3B. The probe according to point 1 or 2, wherein the first angle is between 60 to 90 degrees, preferably less than 90 degrees the second angle is approximately 60 to 90 degrees preferably less than 90 degrees, and the first angle being identical to or different from the second angle.

4. The probe according to any of the points 1-3A or 1-3B, wherein the first region further defines a first top surface and an opposite, parallel first bottom surface, and the second region further defines a second top surface and an opposite, parallel second bottom surface, the base part defining a third top surface, the first, the second and the third top surface being substantially parallel, the outer planar surface being constituted by the first top surface and/or the second top surface, a first thickness defined between the first top surface and the first bottom surface, a second thickness defined between the second top surface and the second bottom surface, the second thickness being smaller than or equal to the first thickness.

5. The probe according to point 4, wherein the second thickness is defined across all of the second regions area a specific part of the second region.

6. The probe according to point 4 or 5, wherein the first top surface and the second top surface being in substantially coplanar the first top surface and the third top surface being substantially coplanar, the second top surface and the third top surface being substantially coplanar, none of the first, second or third top surfaces being coplanar.

7. The probe according to point 4 or 5, wherein the first and the second bottom surfaces are substantially coplanar.

8. The probe according to any of the preceding points, wherein the second region includes at least one aperture extending from the second top surface to the second bottom surface.

9. The probe according to any of the preceding points, wherein the second region includes at least one indentation extending less than the second thickness.

10. The probe according to any of the points 8 or 9, wherein at least one of the apertures or the indentations define an opening having a substantially circular geometry, a substantially oval geometry, a substantially square geometry, a substantially oblong geometry, a substantially triangular geometry, a truncated triangular geometry, any polygonal geometry or any combinations thereof.

11. The probe according to any of the preceding points, wherein the second region includes at least one groove in the second top surface in the second bottom surface.

12. The probe according to point 11, wherein at least one of the at least one groove extends from the third side to the fourth side.

13. The probe according to point 11, wherein the at least one groove extends less that the second width.

14. The probe according to any of the points 11-13 wherein at least one of the grooves defines a rounded cross-section, a square cross-section, a rectangular cross-section, a triangular cross-section, a truncated triangular cross-section, any polygonal cross-section or any combination thereof.

15. The probe according to any of the preceding points, wherein the third the fourth side include a trench extending at least partly from the second top surface to the second bottom surface or from the second bottom surface to the second top surface.

16. The probe according to point 15, wherein the trench defines a rounded cross-section, a square cross-section, a rectangular cross-section, a triangular cross-section, a truncated triangular cross-section or any combination thereof.

17. The probe according to any of the preceding points, wherein the probe is substantially made from a metallic material, an alloying, a semiconductor material, a crystalline or an amorphous material, or any combination thereof; preferably the probe is made from $SiO_2$, $Si_3N_4$, or Si, or is a SOI device or alternatively a layered structure comprising any of the mentioned materials.

18. The probe according to any of the preceding points, wherein the probe further includes conductive paths for establishing electrical connections to each of the plurality of conductive probe arms.

19. The probe according to point 17, wherein the conductive paths extend from the base part to the cantilever part.

20. The probe according to any of the preceding points, wherein the plurality of conductive probe arms are positioned at the outer planar surface.

21. The probe according to any of the preceding points, wherein the first width being 50 to 800 micron, such as 75 to 750 micron, such as 75 to 500 micron, such as 80 to 350 micron, such as 85 to 250 micron, such as 90 to 150 micron, such as 60 to 90 micron, such as 90 to 110 micron, such as 110 to 190 micron, such as 190 to 240 micron, such as 240 to 290 micron, such as 290 to 340 micron, such as 340 to 440 micron, such as 440 to 550 micron, such as 550 to 650 micron, such as 650 to 800 micron, preferably 100 micron, and/or the second width being 40 to 300 micron, such as 50 to 250, such as 75 to 200 micron, such as 100 to 175 micron, such as 120 to 150, such as 40 to 80 micron, such as 80 to 120 micron, such as 120 to 160 micron, such as 160 to 200 micron, such as 200 to 230 micron, such as 230 to 280 micron, such as 280 to 300 micron.

22. The probe according to any of the points 1-20, wherein:
the first width being 0.1 cm to 6 cm, such as 1 cm to 5.5 cm, such as 1.5 cm to 5 cm, such as 2 cm to 4.5 cm, such as 2.5 cm to 4 cm, such as 3 cm to 3.5 cm, such as 0.1 cm to 0.5 cm, such as 0.5 cm to 1 cm, such as 1 cm to 1.5 cm, such as 1.5 to 2 cm, such as 2 cm to 2.5 cm, such as 2.5 cm to 3 cm, such as 3 cm to 3.5 cm, such as 3.5 cm to 4 cm, such as 4 cm to 4.5 cm, such as 4.5 cm to 5 cm, such as 5 cm to 5.5 cm, such as 5.5 cm to 6 cm, and
the second width being 0.1 cm to 6 cm, such as 1 cm to 5.5 cm, such as 1.5 cm to 5 cm, such as 2 cm to 4.5 cm, such as 2.5 cm to 4 cm, such as 3 cm to 3.5 cm, such as 0.1 cm to 0.5 cm, such as 0.5 cm to 1 cm, such as 1 cm to 1.5 cm, such as 1.5 to 2 cm, such as 2 cm to 2.5 cm, such as 2.5 cm to 3 cm, such as 3 cm to 3.5 cm, such as 3.5 cm to 4 cm, such as 4 cm to 4.5 cm, such as 4.5 cm to 5 cm, such as 5 cm to 5.5 cm, such 5.5 cm to 6 cm.

23. The probe according to any of the preceding points, wherein the cantilever part have rounded edges at the distal end.

24. A testing apparatus for testing electric properties on a specific location of a test sample, comprising:
(a) means for receiving and supporting the test sample;
(b) electric properties testing means including electric generator means for generating a test signal and electric measuring means for detecting a measuring signal;
(c) a probe for testing electric properties on a specific location of a test sample, comprising:
1. a supporting body defining opposite first and second parts constituting a flexible cantilever part being flexible in one direction and a base part respectively, the cantilever part defining an outer planar surface substantially perpendicular to the one direction, the base part being adapted for being fixated in a co-operating testing machine,
2. a plurality of conductive probe arms in the cantilever part each of the conductive probe arms freely extending from the cantilever part opposite the base part giving each of the conductive probe arms flexible motion,
3. the cantilever part defining opposite first and second regions, the second region being in contact with the base part, the first region defining first and second side surfaces, each of the first and second side surfaces defining a first angle with the outer planar surface, a first width defined between the first and the second side surfaces, the second region defining third and fourth side surfaces, each of the third and fourth side surfaces defining a second angle with the outer planar surface, a second width defined between the third and the fourth side surfaces,
4. the second width being equal to smaller than the first width,
(d) reciprocating means for moving the probe relative the test sample so as to cause the conductive probe arms to be contacted with the specific location of the test sample for performing the testing of electric properties thereof.

25. The testing apparatus according to point 24, wherein the electric properties testing means further comprises means for electric properties probing of the test sample.

26. The testing apparatus according to point 24-25, wherein the reciprocating means further comprises holding means adapted for co-operatively receiving the base part of the probe.

27. The testing apparatus according to point 24-26, further comprising means for positioning the holding means across the test sample and recording of a location of the holding means relative to the test sample.

28. The testing apparatus according to point 24-27, wherein the means for positioning comprises maneuverability in all spatial directions, being directions coplanar to the test sample and directions perpendicular to the test sample.

29. The testing apparatus according to point 24-28, wherein the means for positioning further comprises means for angular movement of the holding means, such as to provide angular positions for the means for the probe.

30. The testing apparatus according to point 24-29, wherein the means for positioning further comprises means for angular movement of the holding means along an axis parallel to surface of the test sample, such as to provide angular positions for the means for the probe.

31. The testing apparatus according to point 24-30, wherein the means for positioning further comprises means for angular movement of the holding means along an axis perpendicular to surface of the test sample, such as to provide angular positions for the means for the probe.

32. The testing apparatus according to point 24-31, wherein the means for positioning further comprises means for sensing contact between the test sample and the means for the probe.

33. The testing apparatus according to point 24-32, wherein the probe further includes any of the features of any of the points 2-23.

34. A method for providing alignment of a probe relative to a supporting substrate, comprising the steps of:
providing the supporting substrate defining a planar surface and an edge, the substrate further defining a first crystal plane,
providing a first mask at the surface of the supporting substrate, the first mask defining a first exposed area on the surface at the edge,
providing a specific etch reagent, a recess formed by the etch reagent etching the first exposed area, the recess defining a first sidewall an opposing second sidewall, an end wall remote from the edge, and a bottom wall,
providing a probe substrate defining a planar surface and a second crystal plane identical to the first crystal plane,
positioning the probe substrate so that the first and the second crystal planes are positioned identically when forming the probe from the probe substrate using the specific etch reagent, the probe defines congruent surfaces to the first sidewall and the second sidewall.

35. The method according to point 34, wherein the specific etch reagent is provided at a specific concentration.

36. The method according to any of the points 34 or 35, further comprising providing a specific temperature at which the etching is performed.

37. The method according to any of the points 34-36, further comprising providing a specific pressure at which the etching is performed.

38. The method according to any of the points 34-37, where the specific etch reagent the temperature the specific pressure is applied for a specific period of time.

39. The method according to any of the points 34-38, wherein the supporting substrate the probe substrate is Si, GaAs, or any other semiconductor material.

40. The method according to any of the points 34-39, further comprising:
providing a second mask at the bottom wall, the second mask defining a second exposed area, a protruding area formed in the bottom surface by etching the second exposed area using the specific etch reagent.

41. The method according to point 40, wherein the protruding area defines a cross-section having a substantially square, rectangular, triangular, truncated pyramid, polygonal, semi-circular, partly circular, semi-elliptical, partly elliptical geometry or any combinations thereof.

42. The method according to any of the points 34-41, further comprising providing at least one conducting area in the first sidewall the second sidewall the end wall.

43. The method according to point 42, further comprising extending the at least one conducting area onto the planar surface.

44. The method according to any of the points 34-43, further comprising positioning the probe in alignment with the recess.

45. An apparatus for providing alignment of a probe relative to a supporting substrate, comprising:
the supporting substrate defining a surface and an edge, the supporting substrate defining a first crystal plane,
a recess formed by a specific etch reagent in the surface at the edge in the supporting substrate, the recess defining a first sidewall an opposing second sidewall, an end wall remote from the edge, and a bottom wall,
a probe formed from a probe substrate defining a surface and a second crystal plane identical to the first crystal plane using the specific etch reagent so that the probe defines congruent surfaces to the first sidewall and the second sidewall, the probe received in the recess.

46. The apparatus according to point 45, wherein the probe comprises:
a supporting body defining opposite first and second parts constituting a flexible cantilever part being flexible in one direction and a base part respectively, the cantilever part defining an outer planar surface substantially perpendicular to the one direction, the base part being adapted for being received in the recess,
at least one conductive probe arm in the cantilever part, each of the at least one conductive probe arm being positioned opposite the base part,
the cantilever part defining opposite first and second regions, the second region being in contact with the base part, the first region defining first and second side surfaces, each of the first and second side surfaces defining a first angle with the outer planar surface, a first width defined between the first and the second side surfaces, the second region defining third and fourth side surfaces, each of the third and fourth side surfaces defining a second angle with the outer planar surface, a second width defined between the third and the fourth side surfaces, and
the second width being equal to smaller than the first width.

47. The apparatus according to any of the points 45 or 46, wherein the bottom wall includes a protruding part and the probe includes a co-operating groove.

48. The apparatus according to point 47, wherein the protruding part defines a substantially square, rectangular, triangular, truncated pyramid, polygonal, semi-circular, partly circular, semi-elliptical, partly elliptical cross-section or any combinations thereof.

49. The apparatus according to any of the points 47 or 48, wherein the protruding part extends from the first side wall to the second side wall.

50. The apparatus according to any of the points 47 or 48, wherein the protruding part extends from the first side wall to the end wall, the protruding part extends from the second side wall to the end wall.

51. The apparatus according to any of the points 45-50, wherein the supporting substrate further includes at least one substrate alignment mark and the probe includes at least one corresponding probe alignment mark.

52. The apparatus according to point 51, wherein the substrate alignment mark the probe alignment mark is formed as an etched alignment recess and/or alignment protruding part.

53. The apparatus according to any of the points 45-52, wherein the supporting substrate comprises at least two recesses at least two probes.

54. A testing apparatus for testing electric properties on a specific location of a test sample, comprising:
(b) means for receiving and supporting the test sample;
(c) electric properties testing means including electric generator means for generating a test signal and electric measuring means for detecting a measuring signal;
a probe for testing electric properties on a specific location of a test sample, the probe received in an apparatus for providing alignment of the probe relative to a supporting substrate, the apparatus comprising:
the supporting substrate defining a surface and an edge, the substrate defining a first crystal plane,
a recess formed by a specific etch reagent in the surface at the edge of the supporting substrate, the recess defining a first sidewall an opposing second sidewall, an end wall remote from the edge, and a bottom wall defining a minimum height from the surface,
the probe formed from a probe substrate defining a surface and a second crystal plane identical to the first crystal plane using the specific etch reagent so that the probe defines congruent surfaces to the first sidewall and the second sidewall, the probe received in the recess,
(d) reciprocating means for moving the probe relative the test sample so as to cause one or more conductive probe arms positioned on the probe to be contacted with the specific location of the test sample for performing the testing of electric properties thereof.

55. The testing apparatus according to point 54, wherein the electric properties testing means further comprises means for electric properties probing of the test sample.

56. The testing apparatus according to point 54 or 55, further comprising means for positioning the holding means across the test sample and recording of a location of the holding means relative to the test sample.

57. The testing apparatus according to any of the points 54-56, wherein the means for positioning comprises maneuverability in all spatial directions, being directions coplanar to the test sample and directions perpendicular to the test sample, and/or means for angular movement of the holding means, such as to provide angular positions for the means for the probe.

58. The testing apparatus according to any of the points 54-57, wherein the means for positioning further comprises means for angular movement of the holding means along an axis parallel to surface of the test sample, such as to provide angular positions for the means for the probe.

59. The testing apparatus according to any of the points 54-58, wherein the means for positioning further comprises means for angular movement of the holding means along an axis perpendicular to surface of the test sample, such as to provide angular positions for the means for the probe.

60. The testing apparatus according to any of the points 54-59, wherein the means for positioning further comprises means for sensing contact between the test sample and the means for the probe.

61. The testing apparatus according to any of the points 54-60, wherein the probe further includes any of the features of any of the points 35-53.
62. A method for testing electrical properties comprising:
   i) providing a test sample defining a first surface, an area defined on the first surface,
   ii) providing a first test probe comprising:
      a first plurality of probe arms each including at least one electrode for contacting a respective location on the test sample,
   iii) providing a second test probe comprising:
      at least one probe arm including at least one electrode for contacting a location on the test sample,
   iv) providing a test apparatus including a first and a second holder for receiving the first and the second test probes respectively, each of the holders comprising positioning devices for positioning relocating each of the holders in three dimensions, the test apparatus being electrically connected to each of the electrodes of the first test probe and to the at least one electrode of the second test probe, the test apparatus further comprising a sample holder for receiving and holding the test sample in a specific orientation relative to the first and the second test probe,
   v) positioning the electrodes of the probe arms of the first test probe in contact with the area,
   vi) positioning the at least one electrode of the at least one probe arm of the second test probe in contact with the area at a location remote from the first test probe,
   vii) transmitting a test signal from at least one of the electrodes of the first test probe, or, in the alternative from the at least one electrode of the second test probe, and
   viii) detecting the test signal transmission between the first and the second test probe.
63. The method according to point 62, the method further comprising intermediate steps after the step vi):
   a) providing a magnetic field generator for generating a magnetic field,
   b) positioning the magnetic field generator so that the field lines of the magnetic field defines a specific orientation with the area of the test sample.
64. The method according to any of the points 62 or 63, the method further comprising the steps of:
   c) relocating or moving the first test probe relative to the area and/or relocating or moving the second test probe relative to the area, and
   d) repeating step vii) the intermediate steps a) b).
65. A method for testing electrical properties comprising:
   i) providing a test sample defining a first surface, an area defined on the first surface,
   ii) providing a first test probe comprising:
      a first plurality of probe arms each including at least one electrode for contacting a respective location on the test sample,
   iii) providing a second test probe comprising:
      at least one probe arm including at least one electrode for contacting a location on the test sample,
   iv) providing a test apparatus including a first and a second holder for receiving the first and the second test probes respectively, each of the holders comprising positioning devices for positioning relocating each of the holders in three dimensions, the test apparatus being electrically connected to each of the electrodes of the first test probe and to the at least one electrode of the second test probe, the test apparatus further comprising a sample holder for receiving and holding the test sample in a specific orientation relative to the first and the second test probe,
   v) positioning the electrodes of the probe arms of the first test probe in contact with the area,
   vi) positioning the at least one electrode of the at least one probe arm of the second test probe in contact with the area at a location remote from the first test probe,
   vii) providing a magnetic field generator for generating a magnetic field,
   viii) positioning the magnetic field generator so that the field lines of the magnetic field defines a specific orientation with the area of the test sample, and
   ix) detecting electrical signals at the first the second test probes.
66. The method according to point 64, the method further comprising the steps of:
   a) transmitting a test signal from at least one of the electrodes of the first test probe, or, in the alternative from the at least one electrode of the second test probe, and
   b) detecting the test signal transmission between the first and the second test probe.
67. The method according to any of the points 65 or 66, the method further comprising the steps of:
   c) relocating or moving the first test probe relative to the area and/or relocating or moving the second test probe relative to the area, and
   d) repeating step ix) the steps a) b).
68. The method according to any of the points 62-67, wherein the second test probe comprises a plurality of probe arms each comprising at least one electrode.
69. The method according to any of the points 67-68, wherein the positioning-devices are constituted by piezo-electrical actuators.
70. The method according to any of the points 62-69, wherein a multitude of electrode pads are defined on the surface of the test sample, the method further comprising bringing a first specific electrode in contact with a second specific electrode pad, bringing a third specific electrode in contact with a fourth specific electrode pad,
   transmitting a test signal from the first or the third specific electrode, and
   detecting the test signal transmission between the third or the first electrode, respectively.
71. The method according to any of the points 62-70, wherein the probe arms of the first test probe are substantially parallel and the at least one probe arm of the second defines a longitudinal length.
72. The method according to point 71, further comprising:
   arranging the first and the second test probes so that the probe arms of the first test probe are substantially parallel with the at least one probe arm of the second probe arm.
73. The method according to point 71, further comprising:
   arranging the first and the second test probes so that the probe arms of the first test probe are in an orientation substantially orthogonal with the at least one probe arm of the second probe arm.
74. The method according to any of the points 62-73, further comprising: providing at least one additional test probe comprising:
   at least one probe arm including at least one electrode for contacting a location on the test sample,
   and
   providing at least one additional holder in the test apparatus for receiving and holding the at least one additional test probe.
75. The method according to point 74, wherein the at least one probe arm of the at least one additional test probe define a longitudinal length, the method further comprising:

arranging the first, the second and the at least one additional test probe in a arrangement where the probe arms of the first probe defines a first angle with the at least one probe arm of the second test probe, and the probe arms of the first probe define a second angle with the one probe arm of the at least one additional test probe.

76. An apparatus for testing electrical properties comprising:
a housing,
a first and a second holder for receiving a first and a second test probe, respectively, mounted in the housing, each of the holders comprising positioning devices for positioning relocating each of the holders in three dimensions,
the first test probe comprising:
a first plurality of probe arms each including at least one electrode for contacting a respective location on the test sample,
the second test probe comprising:
at least one probe arm including at least one electrode for contacting a location on the test sample,
the test apparatus electrically connected to each of the electrodes of the first test probe and to the at lease one electrode of the second test probe, the test apparatus further comprising a sample holder for receiving and holding a test sample in a specific orientation relative to the first and the second test probe, the test sample defining a first surface, an area defined on the first surface,
a signal generator for generating a test signal electrically connected to a transmitter device for transmitting the test signal via at least one of the electrodes of the first test probe in contact with the area, or, in the alternative, via the at least one electrode of the second test probe in contact with the area, and
a detection device for detecting the test signal transmission between the first and the second test probe.

77. The apparatus according to point 76, wherein the positioning-devices are constituted by piezo-electrical actuators.

78. The apparatus according to any of the points 76-77, wherein the probe arms of the first test probe are substantially parallel and the at least one probe arm of the second defines a longitudinal length,
the first and the second test probes arranged so that the probe arms of the first test probe are substantially parallel with the at least one probe arm of the second probe arm, or
the first and the second test probes arranged so that the probe arms of the first test probe are in an orientation substantially orthogonal with the at least one probe arm of the second probe arm.

79. The apparatus according to any of the points 76-78, further comprising:
at least one additional test probe comprising:
at least one probe arm including at least one electrode for contacting a location on the test sample,
and
at least one additional holder in the housing of the test apparatus for receiving and holding the at least one additional test probe.

80. The apparatus according to point 79, wherein the at least one probe arm of the at least one additional test probe define a longitudinal length, the apparatus further comprising:
the first, the second and the at least one additional test probe arranged in a arrangement where the probe arms of the first probe define a first angle with the at least one probe arm of the second test probe, and the probe arms of the first probe define a second angle with the one probe arm of the at least one additional test probe.

Any of the features mentioned in the points may be combined.

The invention claimed is:

1. An apparatus for providing alignment of a probe relative to a supporting substrate defining a first surface, an edge, and a first crystal plane, comprising:
a recess formed by an etch reagent in said surface at said edge in said supporting substrate, said recess defining a first sidewall, an opposing second sidewall, an end wall remote from said edge, and a bottom wall; and
a probe configured to be received in said recess and formed from a probe substrate defining a second surface and a second crystal plane identical to said first crystal plane using said etch reagent so that said probe defines surfaces that are aligned with said first sidewall and said second sidewall when said probe is received in said recess;
wherein said supporting substrate includes a substrate alignment mark and said probe includes a corresponding probe alignment mark.

2. The apparatus according to claim 1, wherein said probe comprises:
a supporting body defining opposite first and second parts constituting a flexible cantilever part being flexible in one direction and a base part respectively, said cantilever part defining an outer planar surface substantially perpendicular to said one direction, said base part being adapted for being received in said recess,
a conductive probe arm in said cantilever part, said conductive probe arm being positioned opposite said base part,
said cantilever part defining opposite first and second regions, said second region being in contact with said base part, said first region defining first and second side surfaces, each of said first and second side surfaces defining a first angle with said outer planar surface, a first width defined between said first and said second side surfaces, said second region defining third and fourth side surfaces, each of said third and fourth side surfaces defining a second angle with said outer planar surface, a second width defined between said third and said fourth side surfaces, and
said second width being equal to or smaller than said first width.

3. The apparatus according to claim 1, wherein said bottom wall includes a protruding part and said probe includes a co-operating groove.

4. The apparatus according to claim 3, wherein said protruding part defines a cross-section selected from the group consisting of square, rectangular, triangular, truncated pyramid, polygonal, semi-circular, partly circular, semi-elliptical, partly elliptical cross-section and any combinations thereof.

5. The apparatus according to claim 3, wherein said protruding part extends from said first side wall to said second side wall.

6. The apparatus according to claim 3, wherein said protruding part extends from at least one of said first and second side walls to said end wall.

7. The apparatus according to claim 1, wherein said supporting substrate alignment mark is formed as an etched alignment recess on the supporting substrate.

8. The apparatus according to claim 1, wherein said supporting substrate comprises at least two recesses and at least two probes.

9. A testing apparatus for testing electric properties on a specific location of a test sample, comprising:
 (a) means for receiving and supporting said test sample;
 (b) electric properties testing means including electric generator means for generating a test signal and electric measuring means for detecting a measuring signal;
 (c) a probe configured for testing electric properties on a location of said test sample,
 said probe being operable to receive said test signal and to return said measuring signal, said probe being received in an apparatus for providing alignment of said probe relative to a supporting substrate that defines a surface, an edge, and a first crystal plane, said apparatus comprising:
 a recess formed by a etch reagent in said surface at said edge of said supporting substrate, said recess defining a first sidewall, an opposing second sidewall, an end wall remote from said edge, and a bottom wall defining a minimum height from said surface,
 wherein said probe is configured to be received in said recess and is formed from a probe substrate defining a surface and a second crystal plane identical to said first crystal plane using said etch reagent so that said probe defines surfaces that are aligned with said first sidewall and said second sidewall when said probe is received in said recess, and wherein said supporting substrate includes a substrate alignment mark and said probe includes a corresponding probe alignment mark, and
 (d) reciprocating means for moving said probe relative to said test sample so as to cause one or more conductive probe arms positioned on said probe to be contacted with said location of said test sample for performing said testing of electric properties thereof.

10. The testing apparatus according to claim 9, said electric properties testing means further comprising means for electric properties probing of said test sample.

11. The testing apparatus according to claim 9, wherein said reciprocating means includes holding means configured to receive the probe, the apparatus further comprising means for positioning said holding means across said test sample and recording of a location of said holding means relative to said test sample.

12. The testing apparatus according to claim 11, wherein said means for positioning is maneuverable in all spatial directions, being directions coplanar to said test sample and directions perpendicular to said test sample, and includes means for angular movement of said holding means, so as to provide angular positions for said probe.

13. The testing apparatus according to claim 11, wherein said means for positioning further comprises means for angular movement of said holding means along an axis parallel to surface of said test sample, so as to provide angular positions for said probe.

14. The testing apparatus according to claim 11, wherein said means for positioning further comprises means for sensing contact between said test sample and said probe.

* * * * *